US012706134B2

(12) United States Patent
Du et al.

(10) Patent No.: US 12,706,134 B2

(45) Date of Patent: Aug. 11, 2026

(54) MEMORY AND OPERATION METHOD THEREOF, AND MEMORY SYSTEM

(71) Applicant: YANGTZE MEMORY TECHNOLOGIES CO., LTD., Wuhan (CN)

(72) Inventors: ZhiChao Du, Wuhan (CN); Yu Wang, Wuhan (CN); Xiang Fu, Wuhan (CN); Yanhong Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 135 days.

(21) Appl. No.: 18/667,872

(22) Filed: May 17, 2024

(65) Prior Publication Data

US 2025/0239293 A1 Jul. 24, 2025

(30) Foreign Application Priority Data

Jan. 22, 2024 (CN) ........................ 202410088785.6

(51) Int. Cl.

| | |
|---|---|
| ***G11C 11/4076*** | (2006.01) |
| ***G11C 11/408*** | (2006.01) |
| ***G11C 11/4094*** | (2006.01) |
| ***G11C 11/4099*** | (2006.01) |

(52) U.S. Cl.

CPC ...... *G11C 11/4076* (2013.01); *G11C 11/4085* (2013.01); *G11C 11/4094* (2013.01); *G11C 11/4099* (2013.01)

(58) Field of Classification Search

CPC ................................................ G11C 11/4076

See application file for complete search history.

(56) References Cited

U.S. PATENT DOCUMENTS

| | | | | |
|---|---|---|---|---|
| 4,758,995 | A * | 7/1988 | Sato | G11C 11/4096 365/233.5 |
| 6,246,622 | B1 * | 6/2001 | Sugibayashi | G11C 11/565 365/210.12 |
| 2002/0118588 | A1 * | 8/2002 | Kato | G11C 11/4091 365/207 |
| 2004/0174735 | A1 * | 9/2004 | Agata | G11C 7/12 257/E27.097 |

* cited by examiner

*Primary Examiner* — Douglas King

(74) *Attorney, Agent, or Firm* — Conley Rose, P.C.

(57) ABSTRACT

Examples of the present disclosure disclose a memory and an operation method thereof, and a memory system. The memory includes: a memory cell array including a plurality of memory cells; bit lines coupled to the plurality of memory cells; a plurality of word lines coupled to the plurality of memory cells; and a peripheral circuit coupled to the bit lines and the word lines. The peripheral circuit is configured to apply, at a first time period, a first voltage to a selected word line in the plurality of word lines to turn on a cell transistor of a memory cell coupled to the selected word line, and apply, at the first time period, a second voltage to at least one dummy word line in the plurality of word lines to turn on a cell transistor of a memory cell coupled to the at least one dummy word line.

20 Claims, 22 Drawing Sheets

MEMORY AND OPERATION METHOD THEREOF, AND MEMORY SYSTEM

CROSS-REFERENCE TO RELATED APPLICATIONS

The present application claims priority to Chinese Patent Application No. 2024100887856, which was filed Jan. 22, 2024, is titled "MEMORY AND ITS OPERATING METHOD, MEMORY SYSTEM," and is hereby incorporated herein by reference in its entirety.

TECHNICAL FIELD

The present disclosure relates to the technical field of semiconductors, and in particular, to a memory and an operation method thereof, and a memory system.

BACKGROUND

With the continuous development of today's science and technology, semiconductor devices are widely used in a variety of electronic apparatuses and electronic products. For example, as a volatile memory, the dynamic random access memory (DRAM) is a semiconductor memory device commonly used in computers.

SUMMARY

In view of this, examples of the present disclosure provide a memory and an operation method thereof, and a memory system.

A memory is provided according to a first aspect of the present disclosure, comprising:

- a memory cell array comprising a plurality of memory cells;
- bit lines coupled to the plurality of memory cells;
- a plurality of word lines coupled to the plurality of memory cells; and
- a peripheral circuit coupled to the bit lines and the word lines, wherein the peripheral circuit is configured to:
- apply, at a first time period, a first voltage to a selected word line in the plurality of word lines to turn on a cell transistor of a memory cell coupled to the selected word line; and
- apply, at the first time period, a second voltage to at least one dummy word line in the plurality of word lines to turn on a cell transistor of a memory cell coupled to the at least one dummy word line.

A memory system is provided according to a second aspect of the present disclosure, the memory system comprising:

- one or more memories described as the first aspect of the present disclosure; and
- a memory controller coupled to the memory and configured to control the memory.

An operation method of a memory is provided according to a third aspect of the present disclosure. The memory comprises a memory cell array. The memory cell array comprises a plurality of memory cells. Bit lines and a plurality of word lines are coupled to the plurality of memory cells. The operation method comprises:

- applying, at a first time period, a first voltage to a selected word line in the plurality of word lines to turn on a cell transistor of a memory cell coupled to the selected word line; and
- applying, at the first time period, a second voltage to at least one dummy word line in the plurality of word lines to turn on a cell transistor of a memory cell coupled to the at least one dummy word line.

The peripheral circuit provided in the examples of the present disclosure is configured to: at a first time period of a read operation, apply the first voltage to the selected word line in a plurality of normal word lines to turn on the cell transistor of the memory cell coupled to the selected word line. A cell capacitor in the memory cell shares charges with the bit line. At the first time period, the second voltage is applied to the at least one dummy word line to turn on the cell transistor of the memory cell coupled to the dummy word line, such that the cell capacitor of the memory cell is coupled with the bit line, and bit line capacitance $C_{BL}$ can be adjusted. For example, the proportion of fixed capacitance in the bit line capacitance $C_{BL}$ is adjusted to increase a sense margin without increasing an area of the peripheral circuit.

DETAILED DESCRIPTION

Figure 1:
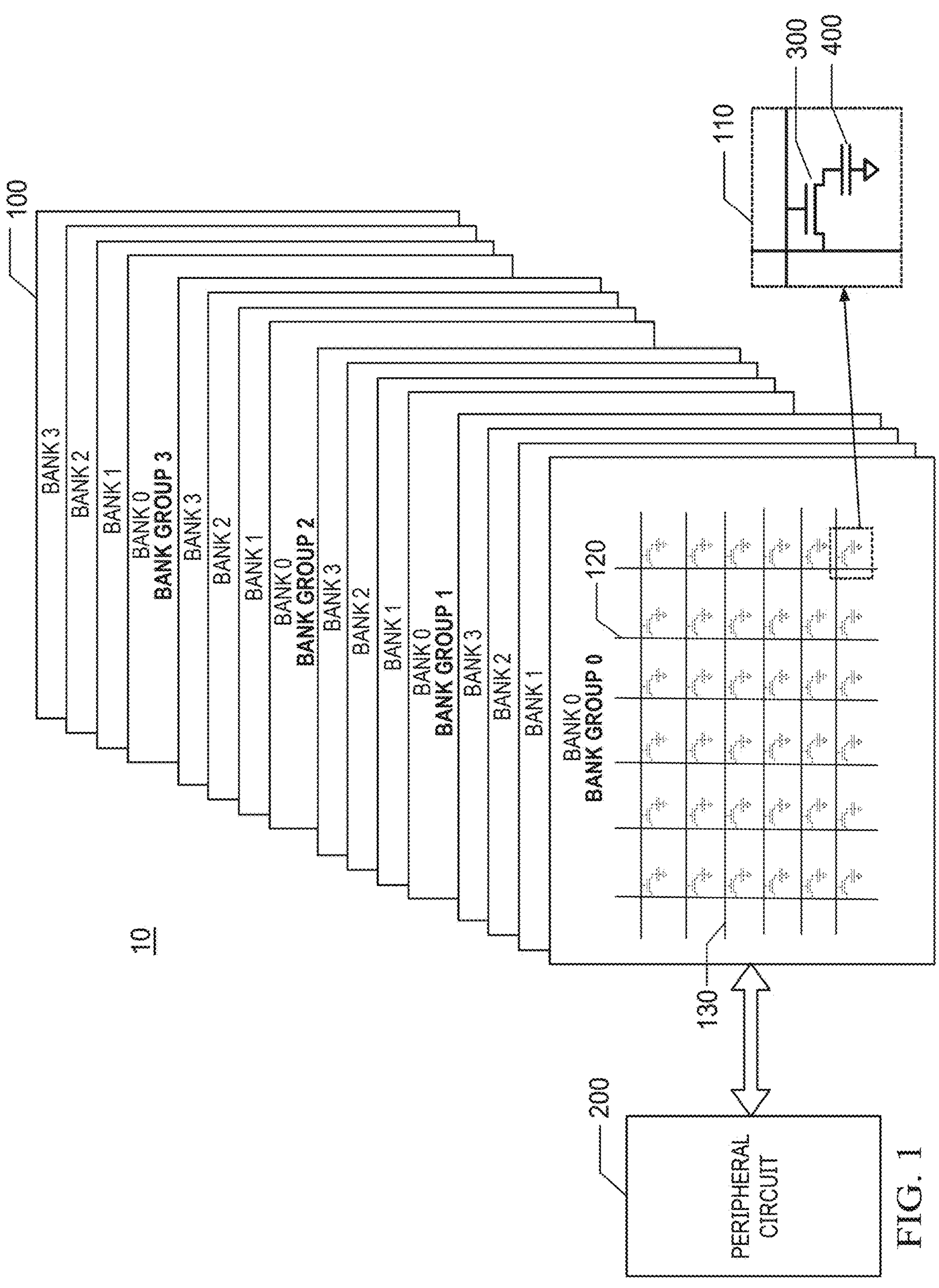
FIG. 1 is a schematic diagram of a memory comprising a peripheral circuit provided by examples of the present disclosure.

Exemplary implementations in the disclosure are described in more detail with reference to drawings. Although the exemplary implementations of the present disclosure are shown in the drawings, it should be understood that the present disclosure may be implemented in various forms and should not be limited by the specific implementations described here. On the contrary, these implementations are provided for more thorough understanding of the present disclosure, and to fully convey a scope disclosed in the present disclosure to a person skilled in the art. In the following descriptions, a lot of specific details are given in order to provide the more thorough understanding of the present disclosure. However, it is apparent to a person skilled in the art that the present disclosure may be implemented without one or more of these details.

The present disclosure may be understood in terms based at least in part on use in context. For example, the term “one or more” as used herein may be used to describe any feature, structure or characteristic in a singular sense, or may be used to describe a combination of features, structures or characteristics in a plural sense. Similarly, terms such as “one” or “the” may be equally understood to convey singular usage or to convey plural usage. Furthermore, the term “based on” may be understood as not necessarily intended to convey an exclusive set of factors, and may instead allow for the presence of additional factors that are not necessarily explicitly described. Terms “consist of” and/or “comprising”, while used in the description, determine the existence of the described features, integers, steps, operations, elements and/or components, but do not exclude the existence or addition of one or more other features, integers, steps, operations, elements, components, and/or groups. A term “and/or” comprises any and all combinations of related items listed.

FIG. 1 is a schematic diagram of a memory comprising a peripheral circuit provided by examples of the present disclosure. As shown in FIG. 1, a memory 10 may comprise a memory cell array 100, and a peripheral circuit 200 coupled to the memory cell array 100. Herein, the memory cell array 100 may be a memory cell array 100 of a DRAM, wherein memory cells 110 may be arranged in the form of a two-dimensional plane.

In some examples, the memory cell 110 of the DRAM may be a 1T1C cell consisting of one transistor 300 and one capacitor 400. The capacitor 400 stores one bit of data in the form of charges or electrons. In an example, data “1” may be represented by more charges stored in the capacitor 400, and data “0” is represented by less charges stored in the capacitor 400. The transistor 300 is configured to visit, read, and write data. A gate of the transistor 300 is connected to a word line, a first source/drain is connected to a bit line 120, and a second source/drain is connected to the capacitor 400. An electrical signal applied to the word line 130 can control the turning on or off of the transistor 300. When the transistor 300 is turned on, the capacitor 400 is connected with the bit line 120, such that electrons can enter the capacitor 400 through the bit line 120 to write the data “1”, or discharge the capacitor 400 through the bit line 120 to write the data “0”. When the transistor 300 is turned off, the capacitor 400 is isolated from the bit line 120, such that data or charges written before are saved. Furthermore, data stored in the capacitor 400 may further be read by measuring charges. Since a transistor in memory cell of the DRAM is very small, and electrons in a capacitor slowly leak, as time goes on, the capacitor needs to be refreshed to charge the leaking electrons.

Continuously referring to FIG. 1, the memory cell array 100 may be organized into a plurality of bank groups (BG), and the number of the bank groups may be 2, 4, 8, etc. The bank group consists of a plurality of banks, and the number of the banks may be 4, 8, etc. The number of the bank groups and the number of banks in the group determine how many banks are comprised in the memory cell array 100. Each bank may be separately activated to execute pre-charging, read, and write operations, etc.

The bank may comprise one or more sub arrays, and the sub array may also be known as a block. Each block comprises a plurality of memory cell rows and a plurality of memory cell columns. Memory cells in the memory cell rows are coupled to the same word line 130, that is, the word line 130 is connected with gates of the memory cells 110 at the same row. The word line 130 selects which of the plurality of memory cell rows is activated to execute the read or write operation. When one word line 130 is activated, all the capacitor 400 at the row are connected to the corresponding bit lines 120, so as to activate all the memory cells at the row. Memory cells in the memory cell columns are coupled to the same bit line 120, that is, the bit line 120 is connected with sources of the memory cells 110 at the same column. The bit line 120 may select one memory cell column to be activated, or the bit line 120 may also select, in a burst mode, the plurality of memory cell columns to be activated.

Figure 2:
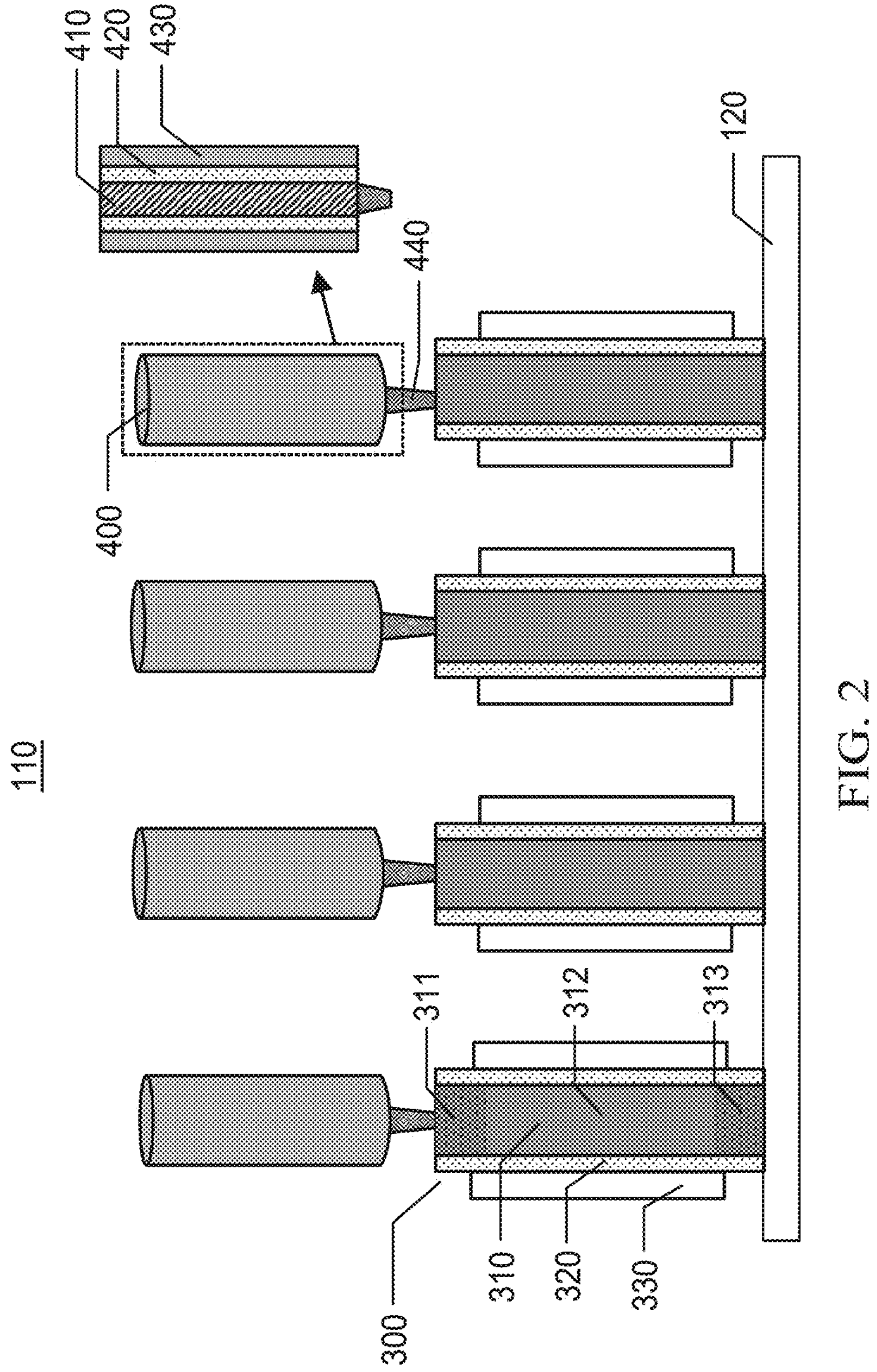
FIG. 2 is a schematic structural diagram of a memory cell array comprising a memory cell provided by examples of the present disclosure.

FIG. 2 is a schematic structural diagram of a memory cell array comprising memory cells provided by examples of the present disclosure. As shown in FIG. 2, the transistor 300 comprises a semiconductor pillar 310 extending along a vertical direction. The semiconductor pillar 310 is configured to form a first source/drain 311, a channel region 312, and a second source/drain 313 of the transistor. In an example, the first source/drain 311 and the second source/drain 313 may be formed by injecting the same type of doping ions to two ends of the semiconductor pillar 310. The doping ion may be a P-type doping ion or an N-type doping ion. The P-type doping ion includes, but is not limited to, boron (B), aluminum (Al), etc. The N-type doping ion includes, but is not limited to, phosphorus (P), arsenic (As), etc. A middle section of the semiconductor pillar 310 may form the channel region without injecting the doping ions, or form the channel region 312 by injecting different types of doping ions from the two ends. In an example, if the two ends of the semiconductor pillar 310 are injected with the P-type doping ions, the middle section is injected with the N-type doping ions, or vice versa. A material of the semiconductor pillar 310 may comprise silicon (such as monocrystalline silicon and polycrystalline silicon), germanium (Ge), silicon germanium (SiGe), gallium arsenide (GaAs), or any other suitable materials.

The transistor 300 further comprises a gate structure located on a sidewall of the semiconductor pillar 310. The gate structure comprises a gate oxide layer 320 and a gate layer 330. The gate oxide layer 320 is located between the gate layer 330 and the sidewall of the semiconductor pillar 310. A material of the gate oxide layer 320 may comprise silicon oxide, silicon nitride, silicon oxynitride, or a high K dielectric material such as hafnium oxide (HfO2), hafnium silicon oxide (HfSiOx), hafnium silicon oxynitride (HfSiON), etc. A material of the gate layer 330 may comprise a conductive material. The conductive material includes, but is not limited to, tungsten (W), cobalt (Co), copper (Cu), aluminum (Al), polysilicon, doped silicon, metal silicide, metal nitride, or any combination thereof. In some examples, the gate layer 330 may comprise a metal nitride layer and a metal layer stacked in sequence, for example, a titanium nitride (TiN) layer and a tungsten layer, wherein the titanium nitride layer is located between the tungsten layer and the gate oxide layer 320. The gate structure may be located on a sidewall of the semiconductor pillar 310 to constitute a single-gate transistor, or may also be located on two opposite sidewalls of the semiconductor pillar 310 to constitute a double-gate transistor. A transistor having a vertical channel structure in FIG. 2 is also known as a vertical channel transistor. In some other examples, the transistor 300 in the memory cell 110 may also be various types of transistors such as a planar transistor.

Each capacitor 400 corresponds to one transistor 300. The capacitor 400 may vertically extend above the transistor 300. The capacitor 400 comprises a lower polar plate 410, a dielectric layer 420 enclosing the lower polar plate 410, and an upper polar plate 430 enclosing the dielectric layer 420, wherein the lower polar plate 410 may be electrically connected with the first source/drain 311 of the transistor 300 through a capacitor contact plug 440. A material of the lower polar plate 410 and a material of the upper polar plate 430 both may comprise a conductive material. The conductive material includes, but is not limited to, tungsten (W), cobalt (Co), copper (Cu), aluminum (Al), etc. A material of the dielectric layer 420 may comprise silicon oxide, silicon nitride, silicon oxynitride, a low K dielectric material (such as doped silicon oxide and silicon fluorine glass), or any combination thereof. It is to be understood that, the memory cell 110 described in FIG. 2 is only used for illustrative purposes only and may be varied in other examples. It is to be understood that, although not shown in FIG. 2, additional components of a memory cell array 301 may also be formed. The additional components include, but are not limited to, a bit line contact plug, a capacitor contact plug, a capacitor support layer, etc.

Figure 3:
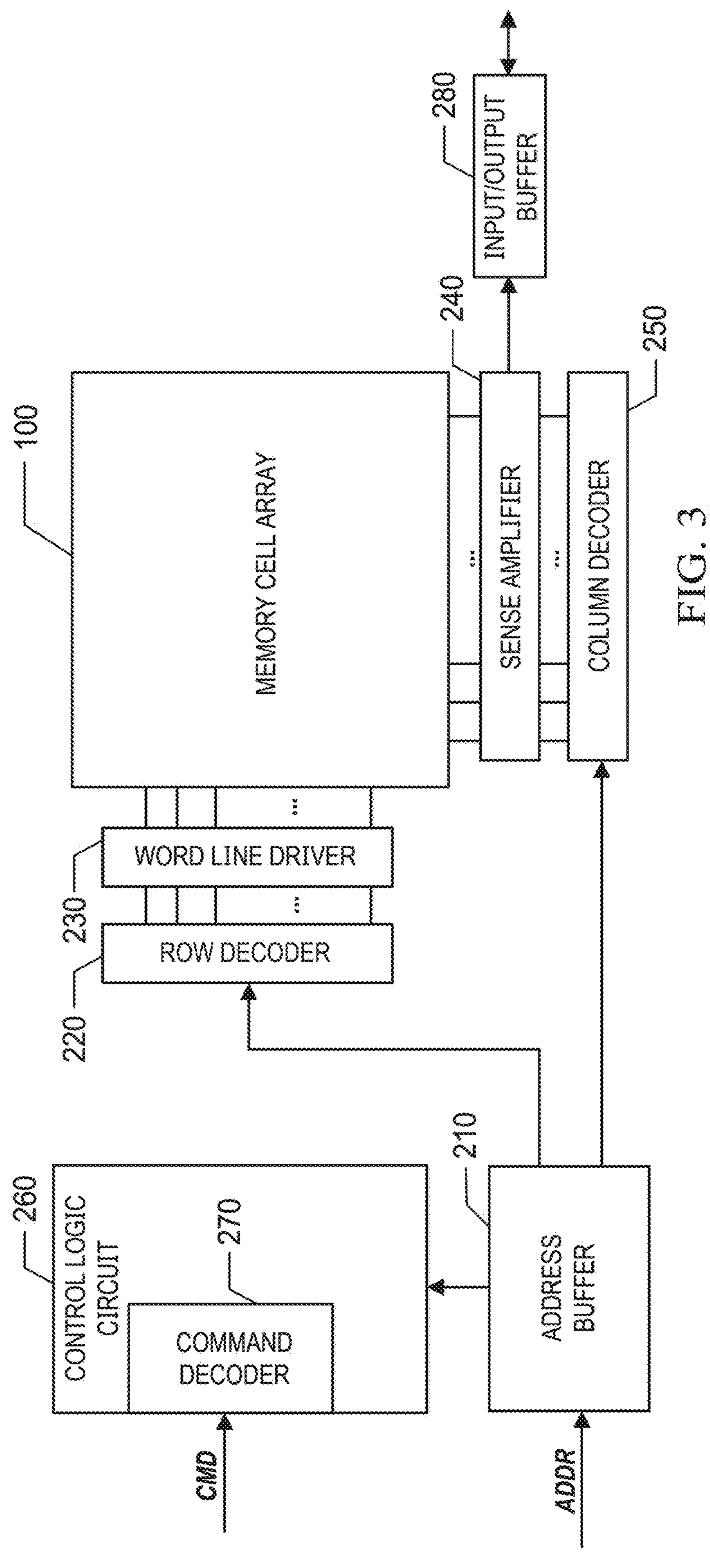
FIG. 3 is a schematic diagram of a peripheral circuit provided by examples of the present disclosure.

Referring back to FIG. 1, the peripheral circuit 200 may be coupled to the memory cell array 100 through the bit line 120 and the word line 130. The peripheral circuit 200 may comprise any suitable analog, digital, and hybrid signal circuits, and is configured to apply at least one of a voltage signal or a current signal to the memory cell 110 through the bit line 120 and the word line 130, and sense the at least one of the voltage signal or the current signal from the memory cell 110, so as to realize a write operation and a read operation of the memory cell array. The peripheral circuit 200 may comprise various types of peripheral circuits formed using a metal-oxide-semiconductor (MOS) technology. FIG. 3 is a schematic diagram of a peripheral circuit 200 provided by examples of the present disclosure. The peripheral circuit 200 may comprise an address buffer 210, a row decoder 220, a word line driver 230, a sense amplifier 240, a column decoder 250, a control logic circuit 260 (comprising a command decoder 270), an input/output buffer 280, etc. In an example, a control circuit corresponding to each bank may comprise the sense amplifier 240, the word line driver 230, the row decoder 220, the column decoder 250, etc. That is, different banks do not share these control circuits. In some examples, control circuits corresponding to all the banks May comprise the control logic circuit 260, the address buffer 210, the input/output buffer 280, etc. It is to be understood that, in some examples, additional peripheral circuits not shown in FIG. 3 may also be comprised, such as a row address latch, a column address latch, a refresh control circuit, a bank group/bank controller, etc.

The sense amplifier 240 is connected to the bit line 120. The sense amplifier 240 may sense minor voltage fluctuations on the bit line 120, and amplify a small voltage swing of the bit line 120 during the read operation to a logic level. That is, a storage value of the capacitor 400 in the memory cell 110 is restored according to the voltage fluctuations of the bit line 120.

The word line driver 230 is connected to the word line 130. The word line driver 230 may be configured to generate different control voltages to drive the word line 130. In an example, the word line driver 230 may be configured to provide a control turn-on voltage to a selected word line according to a row selection signal outputted by the row decoder 220, so as to turn on a transistor of a memory cell coupled to the selected word line.

The address buffer 210 may receive address information ADDR from a memory controller or a host. In an example, an address line connected to the address buffer 210 is multiplexed. The address buffer 210 receives row address information when a row strobe signal RAS is valid, and receives column address information when a column strobe signal CAS is valid. The row address information comprises an address of a bank group, an address of a bank, and a row address, and the column address information comprises a column address. The address buffer 210 transmits the addresses of the bank group and the bank to a bank group/bank controller, transmits the row address to the row decoder 220, and transmits the column address to the column decoder 250.

The row decoder 220 may be configured to decode a unique selected word line from the row address, and may connect the selected word line to the word line driver 230 for providing a control voltage. In some examples, the row decoder 220 may pass through the row address latch to the address buffer 210. The row address latch may be configured to latch the row address sent by the address buffer 210. In another example, the row address latch is configured to latch a row address to be refreshed that is sent by the refresh control circuit.

The column decoder 250 may be configured to decode a unique selected bit line from the column address, or decode a plurality of selected bit lines from the column address in a burst mode. The column decoder 250 may further be configured to generate a column selection signal according to the column address. The column selection signal is used for transmitting, to a data line, storage data of the sense amplifier 240 corresponding to the selected bit line, and transmitting same to the data input/output buffer 280 via the data line. In some examples, the column decoder 250 is connected to the address buffer 210 through the column address latch. The column address latch may be configured to latch the column address sent by the address buffer 210.

The control logic circuit 260 may receive various commands CMD from the memory controller or the host, and generate various control signals for controlling memory operations. The control logic circuit 260 may comprise a command decoder 270. The command decoder 270 may be configured to receive various commands CMD and generate various control signals. The control logic circuit 260 may read or write data from or to the memory cell array 100 by using the control signal, or execute other operations. In an example, the control logic circuit 260 may receive an activation command ACT and a read command READ, and read data from the memory cell. The control logic circuit 260 may also receive a refresh command REF, and control a refresh circuit to execute a refresh operation on a row. The input/output buffer 280 may receive or transmit data from or to the host or the memory controller.

Figure 4:
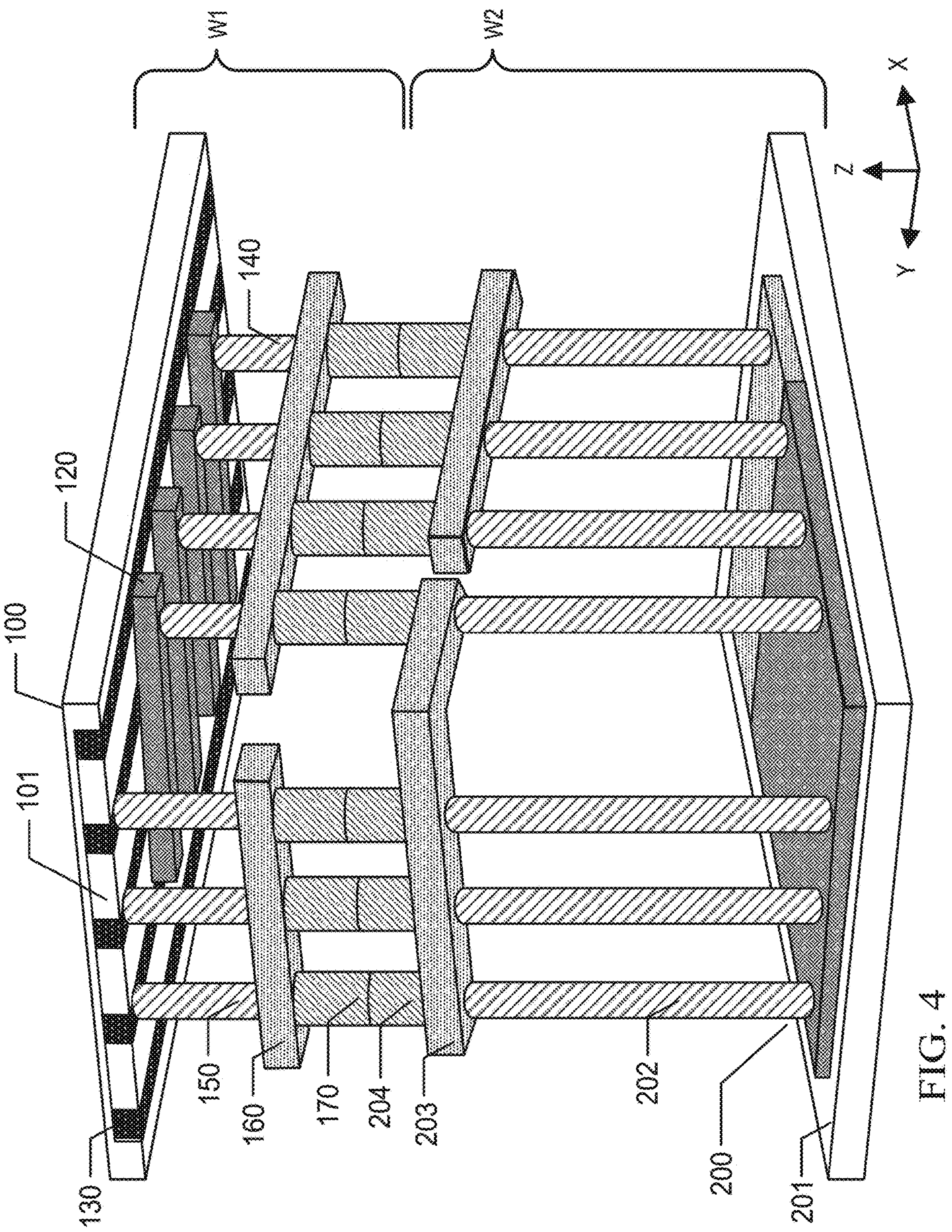
FIG. 4 is a block diagram of a memory comprising a memory cell array and a peripheral circuit provided by examples of the present disclosure.

In some examples, the memory cell array 100 and the peripheral circuit 200 may be located on different wafers. FIG. 4 is a schematic frame diagram of a memory provided by examples of the present disclosure. As shown in FIG. 4, the memory comprises a memory cell array wafer W1 and a peripheral circuit wafer W2, which are connected to each other. The memory cell array wafer W1 comprises the memory cell array 100, and a schematic structural diagram of the memory cell array is not drawn in detail in FIG. 4. In an example, the memory cell array 100 may comprise memory cells shown in FIG. 2. A memory cells comprise a transistor having a vertical channel structure and a capacitor located on one side of the transistor. The memory cells are arranged in an array along a first direction (e.g., X direction) and a second direction (e.g., Y direction), which intersect with each other. In some examples, as shown in FIG. 4, the memory cell array wafer W1 comprises a first substrate 101. The transistors may be formed in the first substrate 101, for example, forming a semiconductor pillar by the first substrate 101. The first substrate 101 includes, but is not limited to, a silicon substrate, a germanium substrate, a silicon germanium substrate, a silicon on insulator, a germanium on insulator, or a silicon germanium on insulator, etc. Other substrates (such as a second substrate) mentioned below may also use at least one of these substrates.

The word lines 130 extend through a transistor array along the first direction (X direction), and are connected with gates of the plurality of transistors arranged in parallel along the first direction. The bit lines 120 are located on sides of the transistors away from the capacitors. The bit lines extend along the second direction (Y direction) and are connected with sources of the plurality of transistors arranged in parallel along the second direction.

Figure 5:
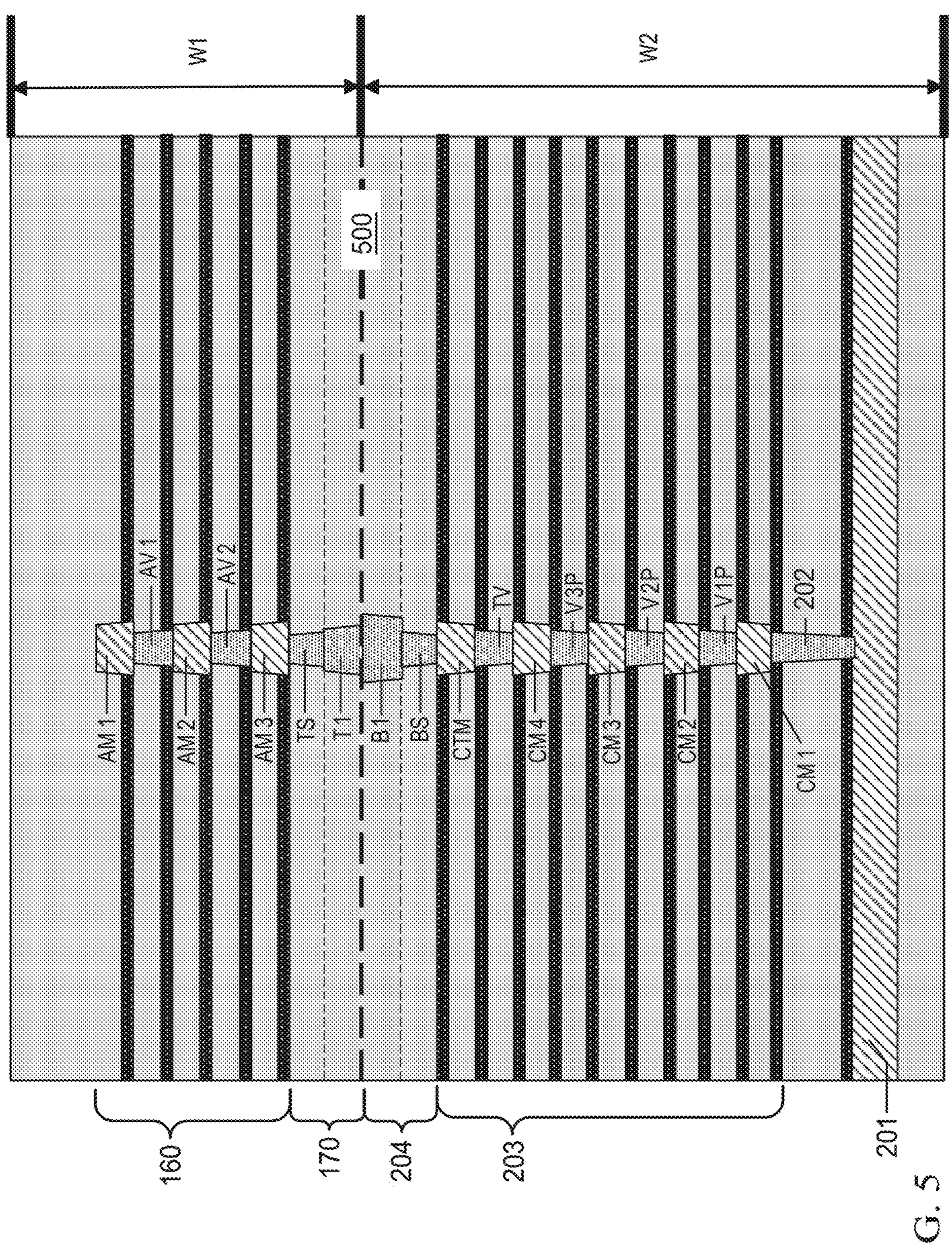
FIG. 5 is a schematic structural diagram of a memory comprising a peripheral circuit provided by examples of the present disclosure.

In some examples, the memory cell array wafer W1 further comprises a word line contact plug 150, a bit line contact plug 140, an array interconnection layer 160, and a first bonding layer 170. FIG. 5 shows a schematic diagram of the array interconnection layer 160, and the first bonding layer 170 of the memory cell array wafer W1. As shown in FIG. 5, the first bonding layer 170 comprises a plurality of first pads T1 exposed from a surface of the memory cell array wafer W1, and first silicon vias TS connecting the first pads T1 and the array interconnection layer 160. The first pads T1 are configured to be connected with second pads B1 in the peripheral circuit wafer W1. The array interconnection layer 160 comprises one or more metal routing layers, and may further comprise a conductive via. The array interconnection layer is configured for re-routing such that the word line contact plug 150 and the bit line contact plug 140 can be connected to the first pads T1. In this example, as shown in FIG. 5, the array interconnection layer 160 comprises metal routing layers AM1, AM2, and AM3 stacked in sequence, a plurality of conductive vias AV1 connecting the adjacent metal routing layers AM1 and AM2, and a plurality of conductive vias AV2 connecting the adjacent metal routing layers AM2 and AM3. One end of the word line contact plug 150 is connected to the word line 130, and the other end is connected to the array interconnection layer 160. One end of the bit line contact plug 140 is connected to the bit line 120, and the other end is connected to the array interconnection layer 160. Both the word line contact plug 150 and the bit line contact plug 140 may be connected to at least one of the metal routing layers M1, M2, and M3.

FIG. 5 also shows a schematic structural diagram of the peripheral circuit wafer W2. The peripheral circuit wafer W2 is configured to form the peripheral circuit 200. The peripheral circuit 200 comprises various devices consisting of MOS transistors. The MOS transistors may comprise PMOS transistors and NMOS transistors. As shown in FIG. 5, the MOS transistors may be formed in a second substrate 201 of the peripheral circuit wafer W2. The plurality of MOS transistors may form devices in the peripheral circuit such as a sense amplifier, a word line driver, etc. The peripheral circuit wafer W2 further comprises a second bonding layer 204 and a peripheral interconnection layer 203 connected to the second bonding layer 204, wherein the second bonding layer 204 comprises a plurality of second pads B1 exposed from a surface of the peripheral wafer, and second silicon vias BS connecting the second pads B1 and the peripheral interconnection layer 203. The peripheral interconnection layer 203 comprises a plurality of metal routing layers and a plurality of conductive plugs. The peripheral interconnection layer 203 may realize an interconnection between the devices of the peripheral circuit, and may also connect some devices to the second pads B1, such that, when the second pads B1 are connected to the first pads T1, these devices may be coupled to the word lines and the bit lines. In this example, as shown in FIG. 5, the peripheral interconnection layer 203 comprises metal routing layers CM1, CM2, CM3, CM4, and CTM stacked in sequence, and conductive vias V1P, V2P, V3P, and TV connecting the adjacent metal routing layers. The peripheral interconnection layer 203 may be connected with the second substrate 201 through a conductive plug 202. It is to be understood that, the number of the metal routing layers in the array interconnection layer 160 and the peripheral interconnection layer 203 should not be limited, and may be designed according to requirements.

In some examples, the memory cell array wafer W1 and the peripheral circuit wafer W2 may be bonded by employing a bonding technology, that is, the plurality of first pads T1 and the corresponding second pads B1 are bonded to realize an electrical connection. In other examples, the memory cell array wafer and the peripheral circuit wafer may also be physically connected and electrically connected in any other way.

It is to be understood that, FIG. 5 is only a schematic diagram of an architecture of a memory provided by examples of the present disclosure. In other examples, the memory cell array and the peripheral circuit may be laid out in any form, for example, the memory cell array and the peripheral circuit may also be laid out on the same wafer. The memory cell array and the peripheral circuit may be separately laid out in different regions on the same wafer, or part of the peripheral circuit may also be laid out in a region where the memory cell array is located.

In some examples, as shown in FIGS. 2 and 4, a memory cell of a DRAM may employ a vertical channel transistor, wherein a capacitor array is located on one side of the transistor array, and the plurality of bit lines are located on the other side of the transistor array. In this DRAM structure, the read operation is affected by coupling capacitance between the adjacent bit lines due to a small spacing between the adjacent bit lines. In an example, at a charge sharing phase of the read operation, if storage values of the adjacent memory cells are opposite, for example, one memory cell stores data "1", and two memory cells on two sides of the memory cell and adjacent to the memory cell store data "0", when data of an intermediate memory cell is read, the coupling capacitance between the memory cells may reduce a sense margin of the intermediate memory cell, resulting in data read errors.

In order to increase the sense margin of the memory cell during the read operation, in some examples, MOS transistors or metal capacitors may be added on a signal path from the bit line to the sense amplifier, for example, the MOS transistors are added to the peripheral circuit wafer W2 shown in FIG. 4, or a length of a metal wire coupled with the bit line is lengthened to increase coupling capacitance of the metal wire, and so on, such that the coupling capacitance on the signal path from the memory cell to the sense amplifier is adjusted to increase the sense margin. However, this may increase an area of a chip, and layout adjustment of the peripheral circuit is relatively large.

Figure 6:
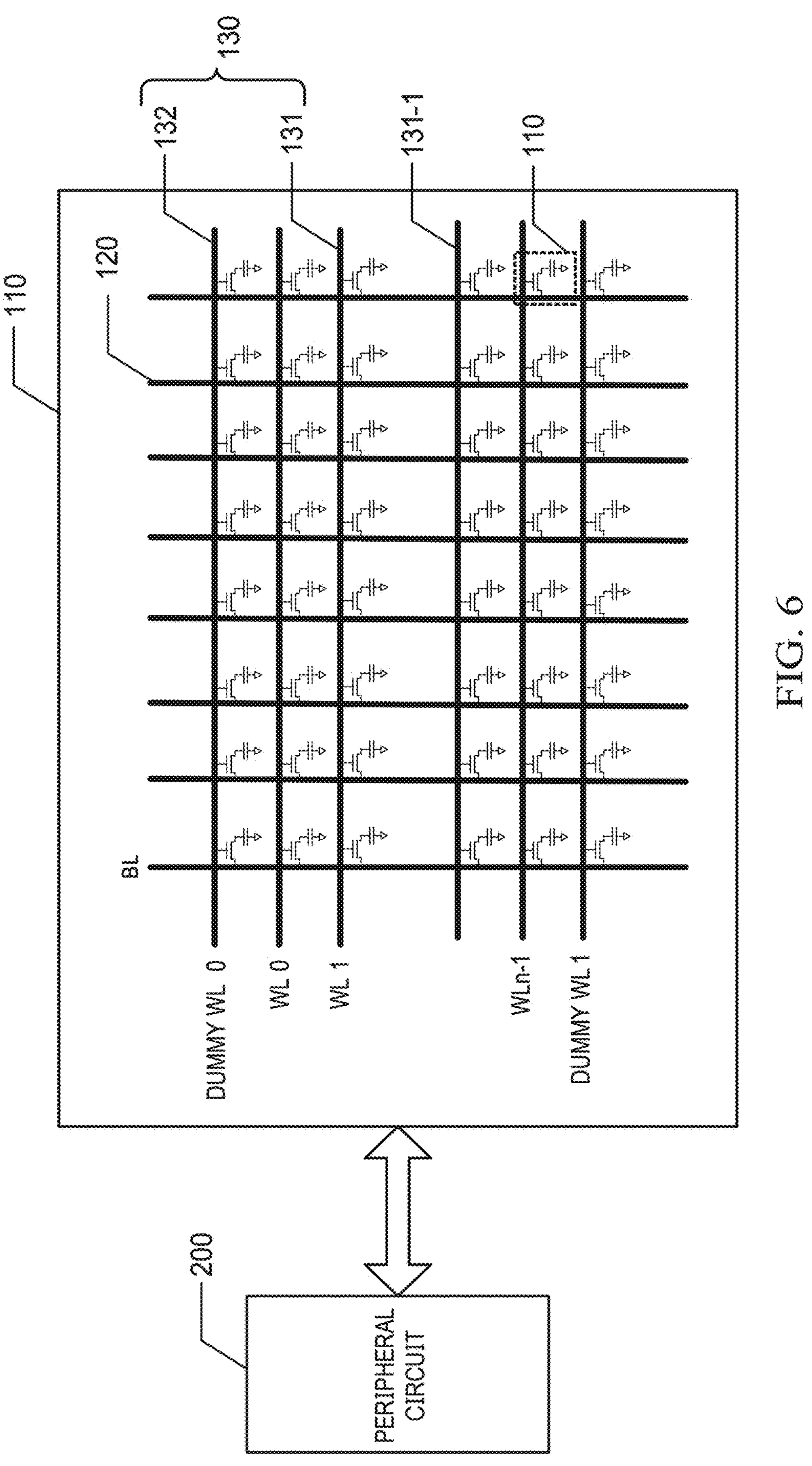
FIG. 6 is a schematic diagram of another memory comprising a peripheral circuit provided by examples of the present disclosure.

Another example of the present disclosure provides another memory, which may increase a sense margin during a read operation. FIG. 6 is a schematic diagram of another memory provided by examples of the present disclosure. As shown in FIG. 6, a memory comprises a memory cell array 100, a bit line 120, a word line 130, and a peripheral circuit 200. Wherein:

- the memory cell array 100 comprises a plurality of memory cells 110, the bit lines 120 are coupled to the plurality of memory cells 110, and the word lines 130 are coupled to the plurality of memory cells 110; and
- the peripheral circuit 200 is coupled to the bit lines 120 and the word lines 130, and the peripheral circuit 200 is configured to:
- apply, at a first time period of the read operation, a first voltage to a selected word line 131-1 in the plurality of word lines 130 to turn on a cell transistor of a memory cell coupled to the selected word line 131-1; and
- apply, at the first time period, a second voltage to at least one dummy word line 132 in the plurality of word lines 130 to turn on a cell transistor of a memory cell coupled to the at least one dummy word line 132.

As shown in FIG. 6, the memory cell array 100 comprises a plurality of memory cell rows and a plurality of memory cell columns, the word lines 130 are coupled to one memory cell row, and the bit lines 120 are coupled to one memory cell column. In an example, the word lines 130 are connected to a gate of each memory cell in the memory cell row, and the bit lines 120 are connected to a source of each memory cell in the memory cell column. In an example, an extending direction of the word lines 130 is parallel to an extending direction of the memory cell row for example, an X direction. An extending direction of the bit lines 120 is parallel to an extending direction of the memory cell column, for example, a Y direction. Each bit line 120 is connected to the sense amplifier, and the sense amplifier is configured to amplify a voltage on the bit line to a recognizable logic level during the data read operation, so as to read data.

In some examples, the read operation of the memory comprises a pre-charging phase, a charge sharing phase, and a sense amplification and write back phase. It is to be understood that, when the sense amplifier senses and amplifies the voltage of one bit line, the other bit line is also needed to provide a reference voltage. Herein, the bit line providing the reference voltage is referred to as a complementary bit line. The bit line and the complementary bit line may be located in different blocks of the same bank, or may also be located in the same block of the same bank.

Figure 7A:
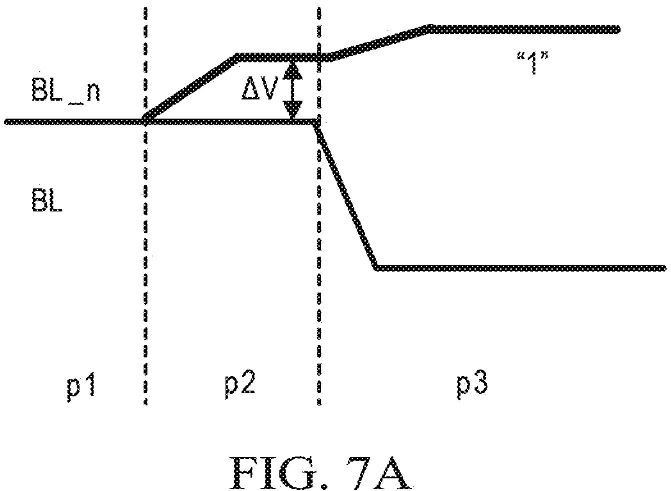
FIG. 7A is a schematic diagram I of voltage variations on bit lines and complementary bit lines during a read operation provided by examples of the present disclosure.
Figure 7B:
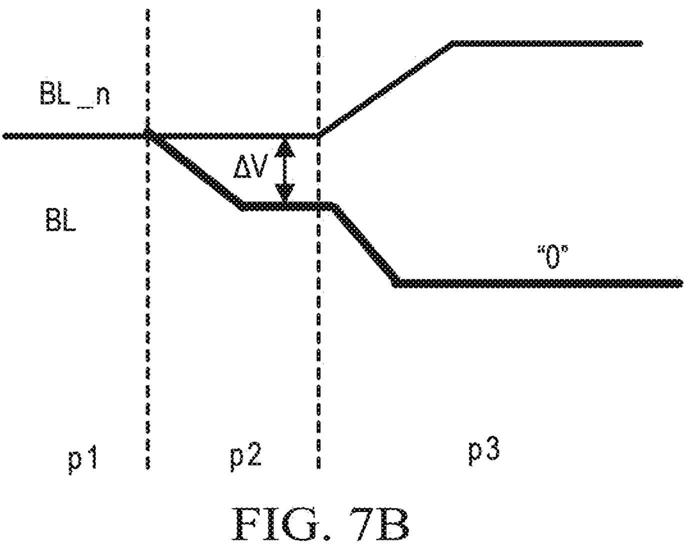
FIG. 7B is a schematic diagram II of voltage variations on bit lines and complementary bit lines during a read operation provided by examples of the present disclosure.

FIGS. 7A and 7B are schematic diagrams of voltage variations on the bit lines and the complementary bit lines during the read operation. As shown in FIGS. 7A and 7B, at the pre-charging phase p1, all the bit lines (comprising the bit lines BL and the complementary bit lines BL_n) in the selected bank are pre-charged to a pre-charging voltage such as VDD/2.

Next, at the charge sharing phase p2, a row is turned on according to a row address, and cell capacitors of all memory cells at the row are coupled to the bit lines corresponding to the cell capacitors. As shown in FIG. 7A, if data stored in one cell capacitor is "1", for example, the cell capacitor is charged to VDD, some charges flow to the bit line BL from the cell capacitor, such that a voltage on the bit line BL is increased a little bit. Likewise, as shown in FIG. 7B, if data stored in one cell capacitor is "0", for example, the cell capacitor is discharged to Vss, some charges flow to the cell capacitor from the bit line BL, such that the voltage on the bit line BL is reduced a little bit. Such behavior that the cell capacitor and the bit line BL share bit line charges and cell capacitor charges is referred to as charge sharing. A charge sharing process of the cell capacitor and the bit line BL slightly changes a voltage level on the bit line. The memory cell coupled to the complementary bit line BL_n is not turned on, such that at the charge sharing phase p2, the complementary bit line BL_n maintains the pre-charging voltage unchanged.

At the sense amplification and write back phase p3, the sense amplifier can sense voltage variations of the bit line, and respectively amplify the voltages of the bit line BL and the complementary bit line BL_n to different logic levels according to theses variations. As shown in FIG. 7A, if the voltage on the bit line BL at the charge sharing phase is increased, the sense amplifier pulls the voltage of the bit line BL up to a logic level corresponding to the data "1", for example, pulls up to VDD, and pulls the voltage of the complementary bit line BL_n down to a logic level corresponding to the data "0", for example, pulls down to a ground level Vss. As shown in FIG. 7B, if the voltage on the bit line BL at the charge sharing phase is reduced, the sense amplifier pulls the voltage of the bit line BL down, for example, pulls down to Vss, and pulls the voltage of the complementary bit line BL_n up, for example, pulls up to VDD.

The sense margin refers to a variation ΔV in the voltage of the bit line BL due to charge sharing with the cell capacitor after the voltage of the bit line BL is stabilized at the charge sharing phase p2. If the sense margin is larger, the sense amplifier can parse out data stored in the cell capacitor more accurately. The sense margin may be affected by coupling capacitance on a signal path from the memory cell to the sense amplifier. Herein, the coupling capacitance on the signal path from the memory cell to the sense amplifier is collectively referred to as bit line capacitance $C_{BL}$.

Figure 8:
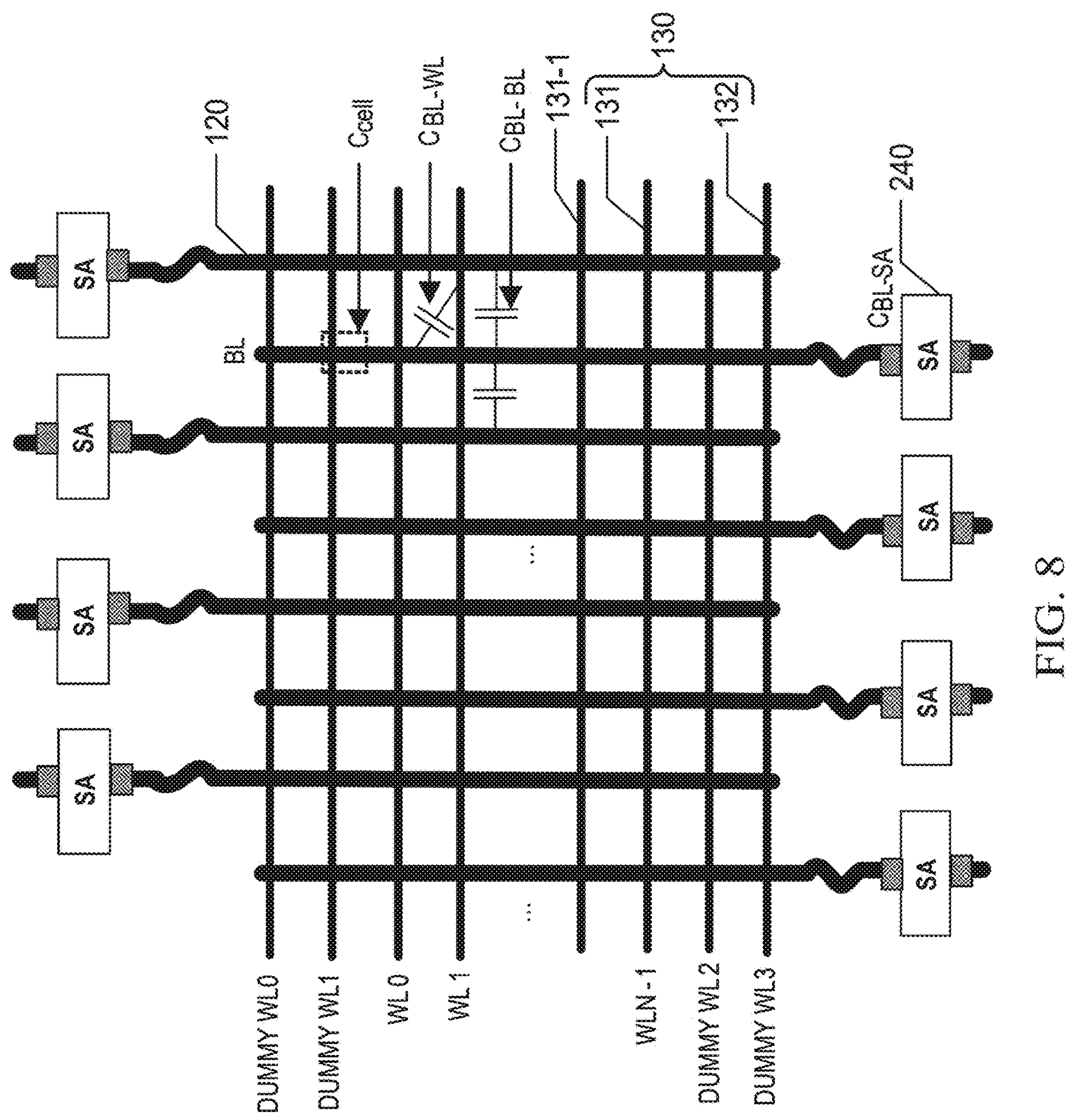
FIG. 8 is a schematic composition diagram of bit line capacitance provided by examples of the present disclosure.

During the read operation on the memory cell, as shown in FIG. 8, the bit line capacitance $C_{BL}$ comprises coupling capacitance $C_{BL\text{-}BL}$ between the bit lines, coupling capacitance $C_{BL\text{-}WL}$ between the bit line and the word line, and coupling capacitance $C_{BL\text{-}SA}$ on a signal line from the bit line to the sense amplifier. In an example, the $C_{BL\text{-}SA}$ may be caused by the array interconnection layer 160, the first bonding layer 170, the second bonding layer 204, the peripheral interconnection layer 203, the conductive plug 202 in FIG. 5, etc.

In some examples, when the proportion of the $C_{BL-BL}$ in the bit line capacitance $C_{BL}$ is large, and when storage values 0001000 (or 1110111) of the plurality of adjacent memory cells are read, a sense margin of island data, such as 1 in the previous data or 0 in the data in the previous bracket, is reduced due to the impact of the coupling capacitance, and a problem of data read errors may occur.

Figure 9:
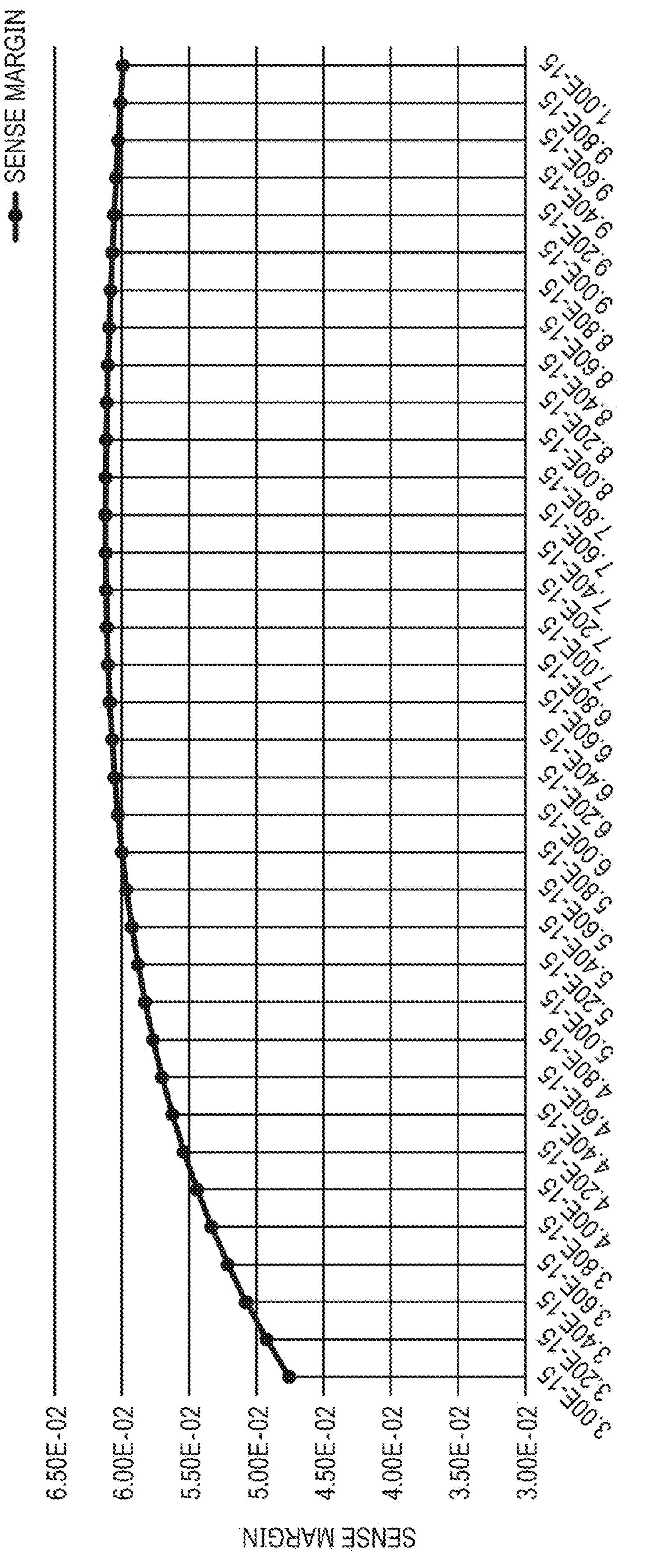
FIG. 9 is a schematic diagram of a sense margin varying with other capacitance provided by examples of the present disclosure.

FIG. 9 is a schematic diagram of a sense margin varying with other capacitances. Herein, other capacitances refer to other capacitances $C_{others}$ in the bit line capacitance $C_{BL}$ other than the $C_{BL-BL}$. Other capacitances $C_{others}$ may be regarded as fixed capacitance, and the fixed capacitance may be understood that the capacitances do not fluctuate greatly because of the storage values of the adjacent memory cells, and can substantially be considered fixed. Other capacitances $C_{others}$ may comprise the $C_{BL-WL}$ and the $C_{BL-SA}$. Using the $C_{BL-WL}$ as an example, at the charge sharing phase, large word line voltages are applied to the word lines coupled to the adjacent memory cells to turn on cell transistors of the memory cells, and the voltage variations in the bit lines are very small relative to the word line voltages, such that the coupling capacitance between them is substantially affected by the word line voltages only, and regardless of whether the storage value of the memory cell is "1" or "0", the impact on the $C_{BL-WL}$ is not large, and the $C_{BL-WL}$ may be considered fixed. The capacitance $C_{BL-BL}$ between the bit lines is obviously affected by the storage value of the memory cell, and thus cannot be regarded as fixed capacitance.

In this example, when the storage values of the plurality of adjacent memory cells are 0001000, the coupling capacitance $C_{BL-BL}$ between the bit line coupled to the memory cell with the measured storage value being "1" and the bit line on one side of the memory cell is approximately 3 fF, and then the coupling capacitance between the bit lines on two sides is approximately 6 fF. If other capacitances $C_{others}$ are adjusted from 3 fF to a larger value, the schematic diagram of the sense margin varying with other capacitances $C_{others}$ shown in FIG. 9 may be obtained.

As shown in FIG. 9, when other capacitances $C_{others}$ are adjusted from 3 fF to approximately 7 fF-8 fF, the sense margin gradually increases; however, if the fixed capacitance is continuously increased, the sense margin begins to reduce instead. It can be interpreted as follows: when the proportion of other capacitances $C_{others}$ increases, the proportion of the $C_{BL-BL}$ in the bit line capacitance $C_{BL}$ reduces, such that the sense margin may be increased; however, continuously increasing other capacitances $C_{others}$ makes the bit line capacitance $C_{BL}$ increased, which leads to a reduction in the sense margin instead. When values of other capacitances $C_{others}$ are at a balance point, a maximum sense margin can be obtained. In the examples of the present disclosure, through testing, when other capacitances $C_{others}$ account for about half of the bit line capacitance $C_{BL}$, the sense margin may reach a large value (comprising the maximum value).

In some examples, in DRAM layout, capacitance values of other capacitances $C_{others}$ are small, for example, about 3 fF, which cannot make the sense margin reach the large value (comprising the maximum value). Therefore, if a good sense margin is desired, other capacitances $C_{others}$ of the bit line capacitance $C_{BL}$ need to be increased.

In the examples of the present disclosure, as shown in FIGS. 6 and 8, the plurality of word lines 130 comprise normal word lines 131 and dummy word lines 132. Memory cells coupled to the normal word lines 131 are configured to store data. The selected word line 131-1 is any one of the normal word lines 131, and a memory cell coupled to the selected word line 131-1 is a selected memory cell. Memory cells coupled to the dummy word lines 132 are not configured to store data, such that the memory cells coupled to the dummy word lines 132 may also be referred to as dummy memory cells.

It is proposed in the examples of the present disclosure, at the charge sharing phase of the read operation, in addition to connecting the selected memory cell to the bit line, the dummy memory cell is also connected to the bit line. A capacitance value of a cell capacitor of the dummy memory cell is $C_{cell}$. When the dummy memory cell is connected to the bit line, other capacitances $C_{other}$ comprise $C_{BL-WL}$, $C_{BL-SA}$, and one or more $C_{cell}$. In some examples, the capacitance value $C_{cell}$ of the cell capacitor is approximately 3.5 fF. When one dummy word line 132 is turned on, the capacitance values of other capacitances $C_{other}$ are equal to 3 fF+3.5 fF=6.5 fF, which may lead to the sense margin being close to an optimal value of the sense margin in FIG. 9.

It is to be understood that, the number of the dummy word lines 132 turned on (e.g., applied with the second voltage) should not be limited, and the number of the dummy word lines 132 turned on may be one, two, or even more according to a relationship between different sense margins and other capacitances $C_{others}$, and according to different capacitance values of cell capacitors of the dummy memory cells.

In some examples, the dummy memory cell is configured to increase voltage variations ΔV on the bit lines at the charge sharing phase by means of adjusting the bit line capacitance $C_{BL}$ to increase the sense margin, and the dummy memory cell does not change the voltage variations of the bit lines by means of contributing charges or sharing the charges. In an example, before the dummy memory cell is connected to the bit line, the dummy memory cell is configured to have a voltage equal to that of the bit line, for example, have an equal pre-charging voltage, such that a storage voltage of the dummy memory cell can be prevented from affecting data read of the selected memory cell.

In some examples, a first time period may be the charge sharing phase of the above read operation. At the first time period, charge sharing is executed between the cell capacitor of the selected memory cell coupled to the selected word line 131-1 and the bit line, and the cell capacitor of the dummy memory cell coupled to the dummy word line 132 is configured to adjust the bit line capacitance $C_{BL}$ to adjust the sense margin of the bit line.

In the examples of the present disclosure, at the first time period of the read operation, after a first voltage is applied to the selected word line in the plurality of normal word lines 131 to turn on the cell transistor of the memory cell coupled to the selected word line, charge sharing is performed between the cell capacitor of the memory cell and the bit line. Meanwhile, at the first time period, a second voltage is applied to the at least one dummy word line 132 to turn on the cell transistor of the memory cell coupled to the dummy word line 132, such that the cell capacitor of the memory cell is coupled with the bit line, and the bit line capacitance $C_{BL}$ (e.g., the proportion of fixed capacitance in the bit line capacitance $C_{BL}$) can be adjusted, so as to adjust the sense margin (e.g., increasing the sense margin) without increasing an area of the peripheral circuit.

In some examples, as shown in FIG. 8, the dummy word lines 132 may be located on two sides of the plurality of normal word lines 131. Taking FIG. 8 as an example, two sides of an integral body formed by the plurality of normal word lines 131 are respectively provided with two dummy word lines 132, wherein the dummy word lines close to the normal word line WL0 are Dummy WL0 and Dummy WL1, and the dummy word lines close to the normal word line WLn−1 are Dummy WL2 and Dummy WL3. It is to be understood that, the number of the dummy word lines 132 on each side may also be one (as shown in FIG. 6) or more than two. In an example, the number of the dummy word lines 132 on two sides may be the same.

In another example, the dummy word lines 132 may also be located between any two adjacent normal word lines 131. The number of the dummy word lines 132 may be one or more. In some other examples, some dummy word lines 132 may be located on the two sides of the integral body formed by the plurality of normal word lines 131, and other dummy word lines 132 may be located between any two adjacent normal word lines 131.

In some examples, one of the other roles of the dummy memory cell coupled to the dummy word line 132 comprises protecting normal memory cells coupled to the normal word lines 131 located on edges, for example, protecting memory cells coupled to the normal word line WL0 and the normal word line WLn−1. In other words, the dummy memory cell may protect the normal memory cells located on the edges, such that the normal memory cells located on the edges have the same surrounding environment as other normal memory cells, so as to improve the accuracy of access data from the normal memory cells located on the edges. Since the dummy memory cell itself serves other purposes, it can be considered that the adjustment of the bit line capacitance $C_{BL}$ by the dummy memory cell only adds functions of the dummy memory cell, such that, in this example, the mode of turning on the dummy word line 132 to increase the sense margin can save more chip areas compared with the way of adding the MOS transistors or metal capacitors.

In some examples, a bank comprises a plurality of blocks, and each of the plurality of blocks comprises the normal word line WL and the dummy word line Dummy WL. In an example, the plurality of blocks in the bank may have the same array structure, and the number of the bit lines, normal word lines, and dummy word lines coupled to the plurality of blocks is also the same.

Figure 10:
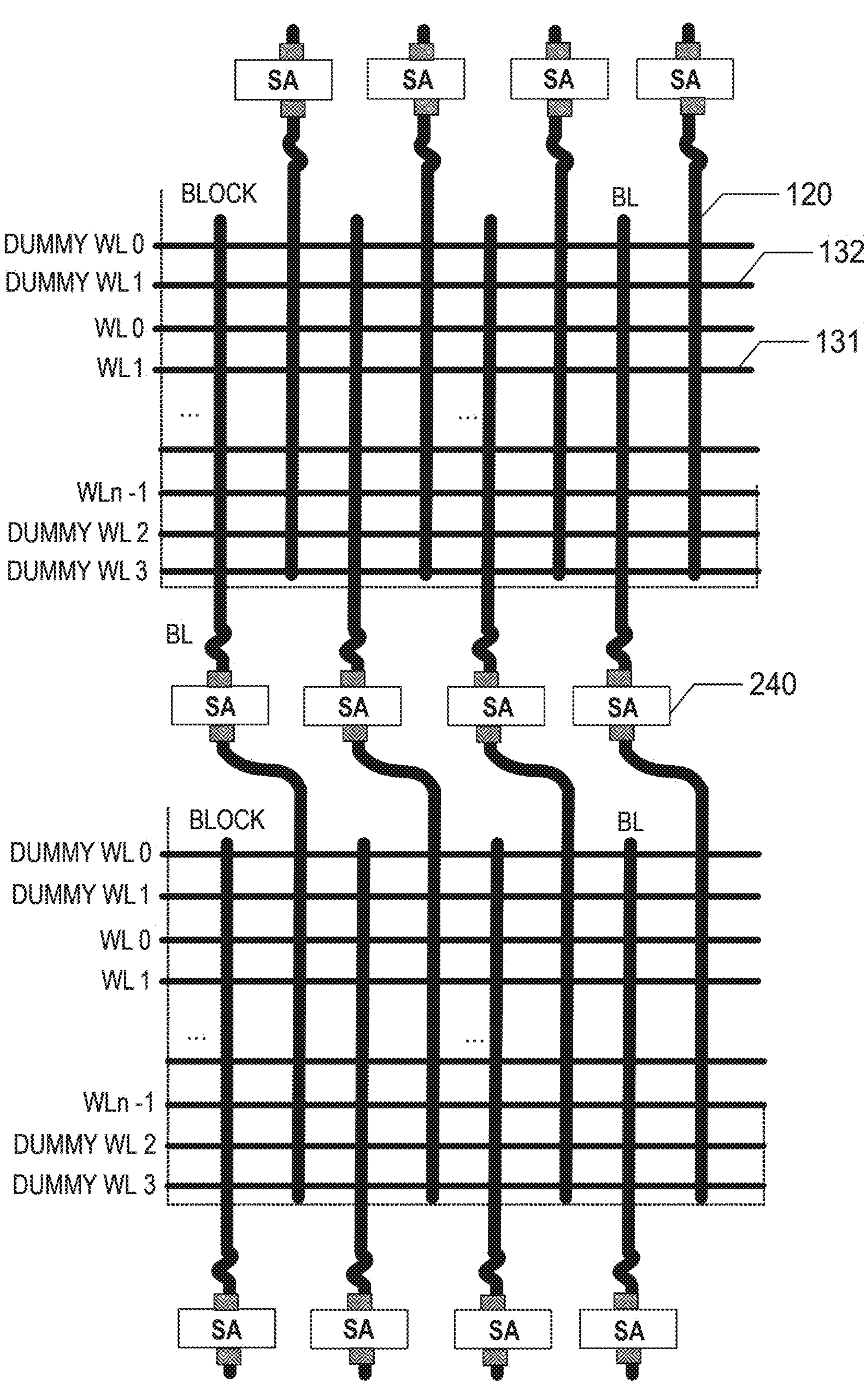
FIG. 10 is a schematic diagram of any two blocks in a bank provided by examples of the present disclosure.

In an implementation, each of the plurality of blocks may have the array structure shown in FIG. 8. FIG. 10 shows a schematic diagram of any two blocks of the plurality of blocks. As shown in FIG. 10, two blocks Block comprise the same number of the bit lines 120, normal word lines 131, and dummy word lines 132. The number of the dummy word lines 132 in each block is 4. Each of the two sides of the integral body formed by the plurality of normal word lines 131 along the extending direction of the bit lines is provided with two dummy word lines 132.

In some examples, the bit line coupled to the sense amplifier and the complementary bit line may be located in different blocks of the same bank, or may also be located in the same block of the same bank. In this example, as shown in FIG. 10, one end of the sense amplifier 240 is connected to one bit line 120 in one block Block, and the other end is connected to one bit line 120 of the other block. Two blocks Block coupled to the same sense amplifier may be adjacent to each other.

Figure 11:
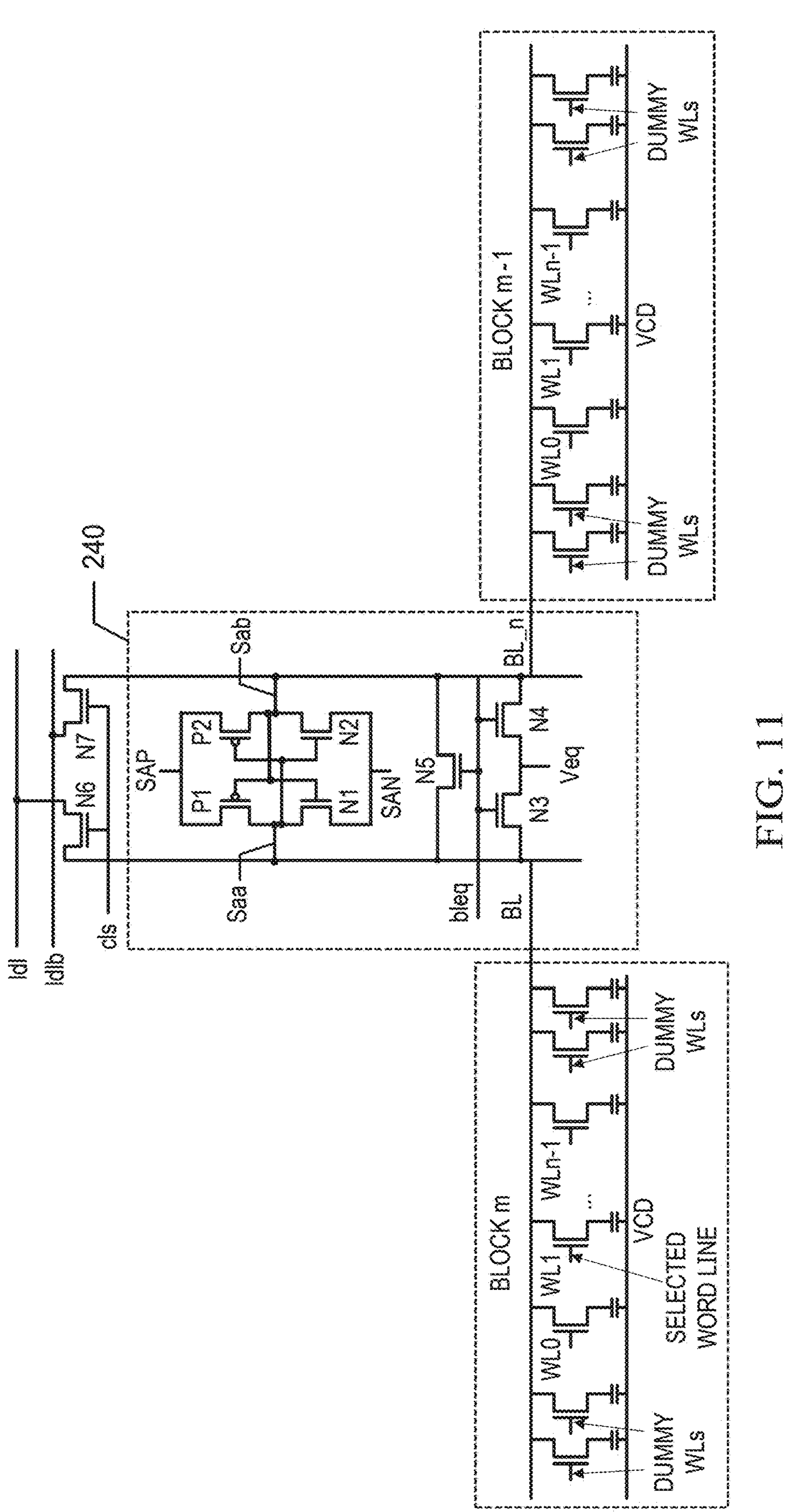
FIG. 11 is a schematic diagram of a circuit comprising a bank of a sense amplifier provided by examples of the present disclosure.

FIG. 11 shows a schematic diagram of a circuit comprising a bank of a sense amplifier. The sense amplifier 240 in FIG. 11 may be any sense amplifier 240 in FIG. 10. The sense amplifier 240 is coupled to a first block Block m and a second block Block m−1. A timing diagram of a voltage applied to the dummy word line during the read operation is described in detail below with an example that one normal word line, e.g., WL1, of the first block Block m is activated to execute the read operation. As shown in FIG. 11, the normal word line WL1 in the first block Block m is activated as a selected word line, and the bit line that is in the second block Block m−1 and connected to the sense amplifier 240 is used as the complementary bit line BL_n to participate in the read operation.

Continuously referring to FIG. 11, the sense amplifier 240 comprises two PMOS transistors P1 and P2, and two NMOS transistors N1 and N2. Sources of the transistors P1 and P2 are connected to a power supply node SAP, and sources of the transistors N1 and N2 are connected to a power supply node SAN. A drain of the transistor N1, a drain of the transistor P1, a gate of the transistor P2, and a gate of the transistor N2 are connected, and a junction is a sense node Saa. A drain of the transistor N2, a drain of the transistor P2, a gate of the transistor P1, and a gate of the transistor N1 are connected, and a junction is a sense node Sab.

The sense node Saa is connected to the bit line BL, and the sense node Sab is connected to the complementary bit line BL_n. The sense amplifier 240 further comprises pre-charging transistors N3 and N4, and a balanced transistor N5, wherein drains of the pre-charging transistors N3 and N4 are respectively connected to the bit line BL and the complementary bit line BL_n, sources of the pre-charging transistors are connected to a power supply node Veq, gates of the pre-charging transistors are controlled by a pre-charging signal bleq, and when the bleq is activated (for example, at a high level), the pre-charging transistors N3 and N4 are turned on, and a pre-charging voltage Veq is provided to the bit line BL and the complementary bit line BL_n. A source and drain of the balanced transistor N5 are respectively connected to the bit line BL and the complementary bit line BL_n to provide a conductive path between the bit line BL and the complementary bit line BL_n, so as to balance voltages of the bit line BL and the complementary bit line BL_n at the pre-charging phase. A gate of the balanced transistor N5 is controlled by the bleq, and the balanced transistor is turned on when the bleq is activated.

The memory further comprises column selection transistors N6 and N7, wherein a source of the column selection transistor N6 is connected to the bit line BL, and a drain is connected to a local data line ldl; a source of the column selection transistor N7 is connected to the complementary bit line BL_n, and a drain is connected to a differential local data line ldlb; gates of the column selection transistors N6 and N7 are connected to column selection lines, and are controlled by a column selection signal cls; and when the cls is activated (for example, in a high level), the column selection transistors N6 and N7 are turned on to transmit data latched by the sense amplifier to the local data line ldl.

Figure 12:
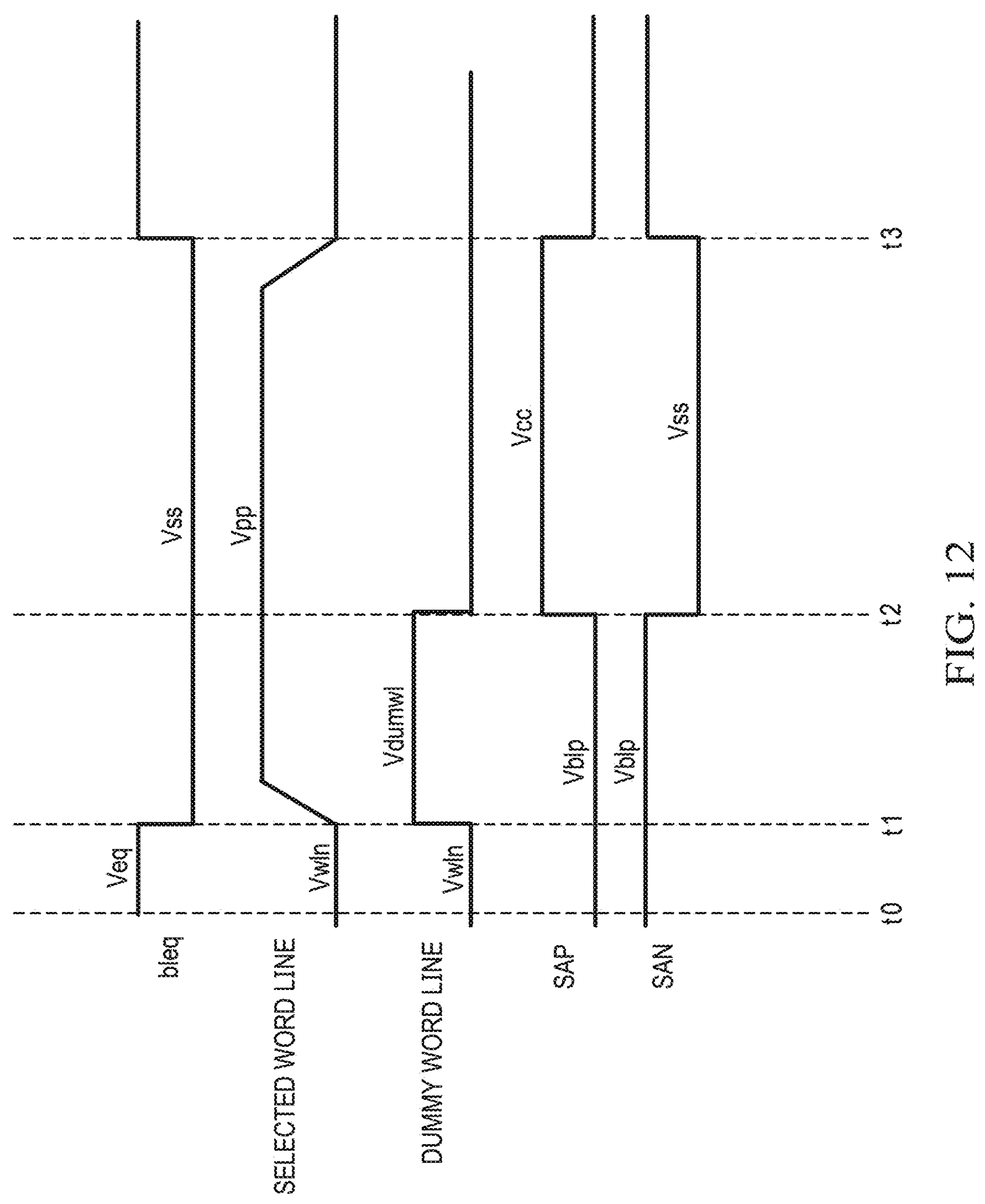
FIG. 12 is a signal timing diagram I during a read operation executed by the sense amplifier shown in FIG. 11.

FIG. 12 is a signal timing diagram during a read operation executed by the sense amplifier shown in FIG. 11, as shown in FIG. 12. At a moment from t0 to t1, a control turn-off voltage Vwln is applied to all the word lines (comprising the normal word lines WL and the dummy word lines Dummy WL); and the pre-charging signal bleq is at a high level, the pre-charging transistors N3 and N4 and the balanced transistor N5 are turned on, the bit line BL and the complementary bit line BL_n are pre-charged to the pre-charging voltage Veq, this time period is the pre-charging phase, and the bit line BL, the complementary bit line BL_n, and the sense amplifier 240 are in a balanced state at the time period. Voltages of the power supply nodes SAP and SAN both are balanced voltages Vblp, and a strong drive voltage is not provided to the sense amplifier.

At a time period from t1 to t2, e.g., the first time period, bleq is switched to a low level, the pre-charging transistors N3 and N4 and the balanced transistor N5 are off to stop providing the pre-charging voltage Veq to the bit line BL and the complementary bit line BL_n. The first voltage Vpp is applied to a selected word line WL sel to turn on a cell transistor of a selected memory cell coupled to the selected word line WL sel, such that charge sharing is performed between a cell capacitor of the selected memory cell and the bit line, and a small change is generated in the voltage of the bit line BL. The time period from t1 to t2 is referred to as the charge sharing phase.

At this time period, a second voltage Vdumwl is applied to at least one dummy word line to turn on a cell transistor of a dummy memory cell coupled to the dummy word line, so as to make a cell capacitor of the dummy memory cell connected to the bit line to adjust the bit line capacitance $C_{BL}$ of the bit line BL, such that the voltage variations ΔV of the bit line are increased, e.g., the sense margin is increased.

At a time period from t2 to t3, which is also referred to as the sense amplification and write back phase, the power supply node SAP is switched to a high supply voltage Vcc, the power supply node SAN is switched to a ground voltage Vss, the sense amplifier is driven to amplify voltages on the sense nodes Saa and Sab (e.g., the bit line BL and the complementary bit line BL_n) to make voltages of the bit line BL and the complementary bit line BL_n respectively reach logic levels corresponding to data “1” or “0”, so as to read data. Furthermore, at this time period, the first voltage Vpp is still applied to the selected word line WL sel, such that the selected word line is in an on state, and the bit line BL may charge the cell capacitor of the selected memory cell to refresh data in the memory cell.

In some examples, as shown in FIG. 12, the control turn-off voltage Vwln is applied to the dummy word line at this time period, and the cell transistor of the dummy memory cell is off, such that the cell capacitor of the dummy memory cell is no longer connected to the bit line. It may be understood that, when the sense amplifier starts to amplify the voltage of the bit line that has been subjected to charge sharing, the sense margin has been fully utilized, such that the cell transistor of the dummy memory cell is allowed to be off at this time period.

After a moment t3, the bleq is switched to a high level to make the pre-charging transistors N3 and N4 and the balanced transistor N5 turned on, so as to provide the pre-charging voltage Veq to the bit line BL and the complementary bit line BL_n again.

Furthermore, at the moment from t0 to t3, the column selection signal cls is always at a low level to make the column selection transistors N6 and N7 in an off state. After the moment t3, the cls may be switched to a high level to transmit the data latched by the sense amplifier to the local data line ldl, so as to transmit same to a data input/output buffer. The column selection signal cls may be obtained based on column address information in a read command. At the moment from to to t3, the pre-charging voltage Veq is applied to the local data line ldl and the differential local data line ldlb.

In some examples, the peripheral circuit is configured to: at a second time period before the first time period, apply the pre-charging voltage to the bit line, and apply the second voltage to the at least one dummy word line.

The second time period may be any time period before the first time period, e.g., when the pre-charging voltage is applied to the bit line at any time period before the second time period, the dummy word line may be turned on to charge the cell capacitor of the dummy memory cell or discharge to the pre-charging voltage.

In some examples, the second time period may be comprised in the pre-charging phase. The second voltage is applied to the dummy word line at the start of a first moment of the pre-charging phase, and the applying is not stopped until the end of the charge sharing phase. The first moment may be any moment in the pre-charging phase excluding an end moment. The second time period is from the first moment to a start moment of the charge sharing phase.

Figure 13:
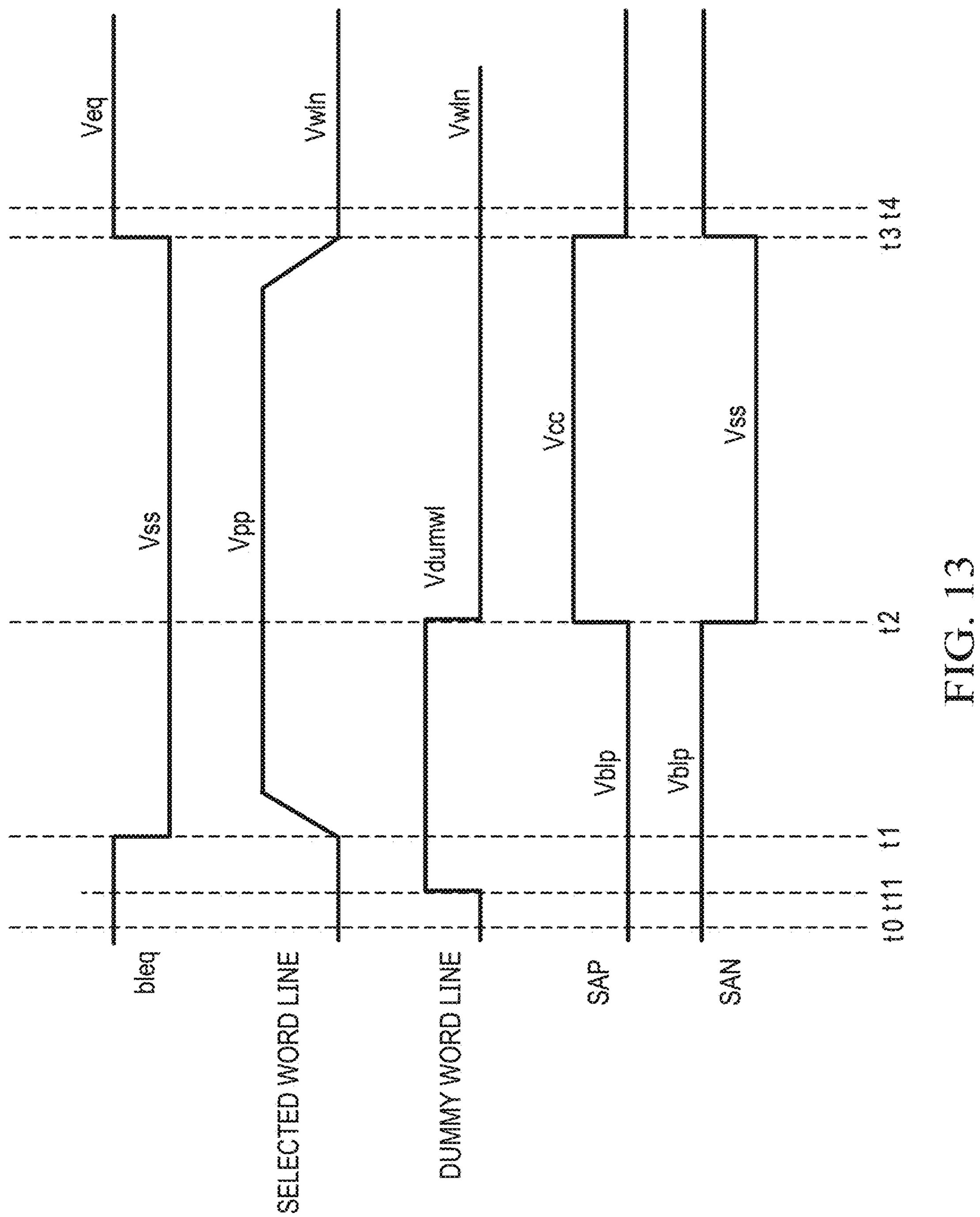
FIG. 13 is a signal timing diagram II during a read operation executed by the sense amplifier shown in FIG. 11.

FIG. 13 is another signal timing diagram during a read operation executed by the sense amplifier shown in FIG. 11. Compared with FIG. 12, a difference is application timing of the voltage of the dummy word line. As shown in FIG. 13, in this example, at the first moment t11 after a period of time from the start of the pre-charging phase, the second voltage Vdumwl is applied to the dummy word line, and the applying is not stopped until the end moment t2 of the charge sharing phase. In another example, the second voltage Vdumwl is started applying to the dummy word line while the signal bleq is switched to a high level.

In this example, during at least part of the pre-charging phase, the second voltage is applied to the dummy word line to make the cell capacitor of the dummy memory cell connected to the bit line and charged or discharged to be equal to the voltage of the bit line. In this way, at the charge sharing phase, the dummy memory cell does not contribute charges to the bit line or share the charges of the bit line, such that the accuracy of data read of the selected memory cell can be prevented from being affected.

In some examples, the peripheral circuit is further configured to:

at a third time period after the second time period, amplify the voltage of the bit line that has been subjected to charge sharing;

apply the pre-charging voltage to the bit line at a fourth time period after the third time period; and apply the second voltage to the at least one dummy word line at the third time period and the fourth time period.

The third time period may be in the sense amplification and write back phase, the sense amplifier amplifies the voltage of the bit line that has been subjected to charge sharing. At the fourth time period, the pre-charging voltage is re-applied to the bit line. In this example, the second voltage is maintained to be applied to the dummy word line at the third time period and the fourth time period, until the fourth time period ends.

Figure 14:
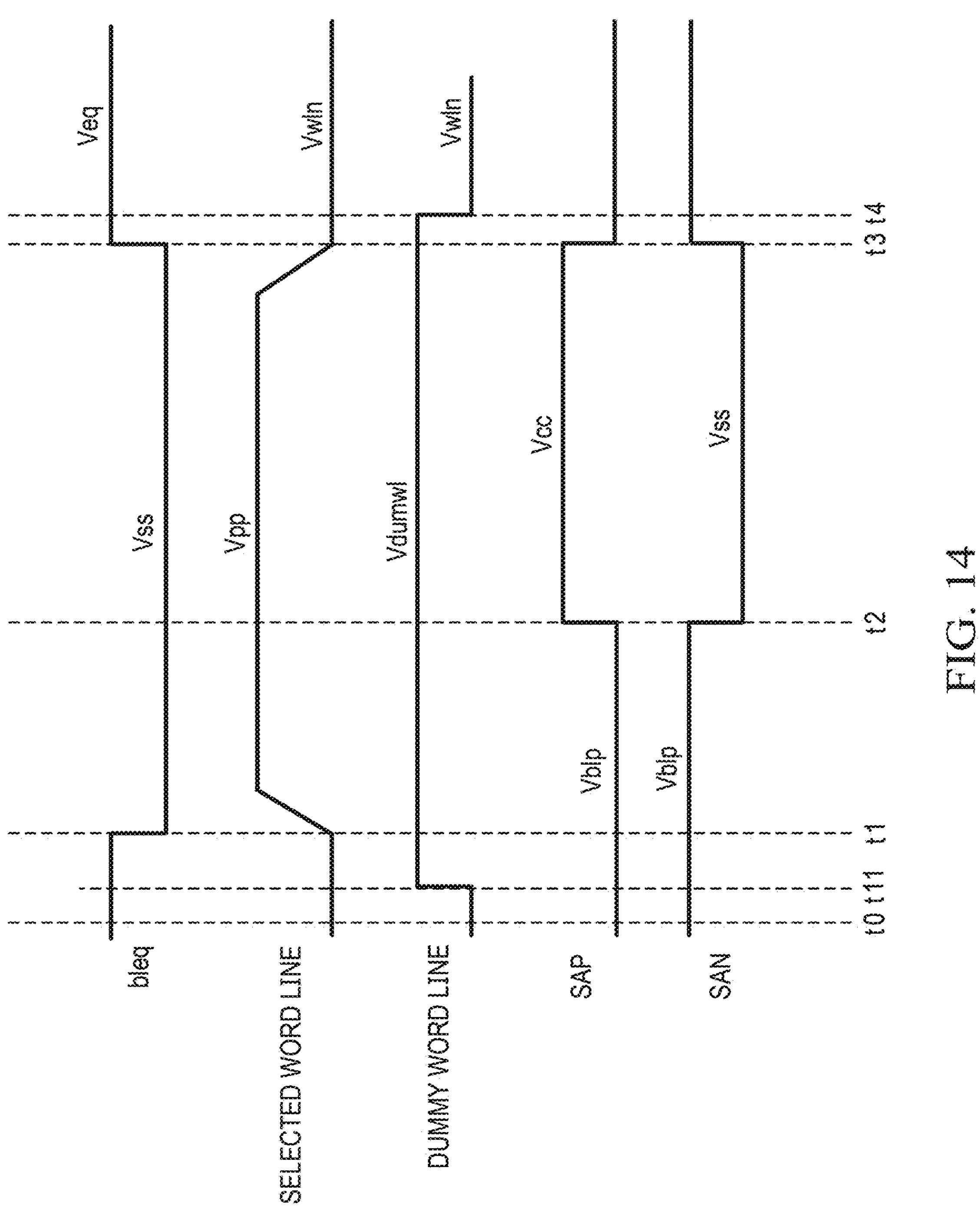
FIG. 14 is a signal timing diagram III during a read operation executed by the sense amplifier shown in FIG. 11.

FIG. 14 is another signal timing diagram during a read operation executed by the sense amplifier shown in FIG. 11. A difference between this figure and FIG. 13 is the application timing of the voltage of the dummy word line. In this example, as shown in FIG. 14, the second voltage Vdumwl is applied to the dummy word line from the first moment t11 of the pre-charging phase, and is maintained until the second voltage is stopped applying at a second moment t4 after the sense amplification and write back phase ends. The fourth time period is from an end moment t3 of the sense amplification and write back phase to the second moment t4. Herein, the read operation also comprises the fourth time period.

Although the second voltage may also be stopped from applying to the dummy word line at the sense amplification and write back phase, if the cell transistor of the dummy memory cell is turned off at the moment, the voltage of the cell capacitor of the dummy memory cell is equal to the voltage of the bit line that has been subjected to the amplification operation, e.g., the storage voltage of the cell capacitor is large. It may be understood that, if the cell transistor is to be turned on, it needs to be met that a difference value Vgs between a gate voltage and a voltage of a second source/drain is greater than a threshold voltage Vth. If the storage voltage of the cell capacitor is large, the voltage of the second source/drain of the cell transistor is large, and a larger gate voltage needs to be applied if the cell transistor is required to turn on, e.g., the larger second voltage Vdumwl. In this example, the second voltage Vdumwl is stopped from applying after the sense amplification and write back phase ends and at the second moment t4 during re-application of the pre-charging voltage to the bit line, such that the storage voltage of the cell capacitor may be equal to the pre-charging voltage Veq, the pre-charging voltage Veq is less than the voltage of the bit line that has been subjected to the amplification operation, and thus the second voltage Vdumwl may be reduced to save power consumption.

In some examples, a phase for the read operation on the memory cell coupled to the selected word line comprises the second time period, the first time period, the third time period, and the fourth time period. The peripheral circuit is further configured to:

apply the second voltage to the at least one dummy word line at another time period, wherein the other time period comprises a time period between an end moment of the fourth time period and a start moment of a second time period for a next read operation phase.

In this example, the second time period, the first time period, the third time period, and the fourth time period of the read operation, as well as other time periods between the adjacent read operations, form all time periods when the memory is in a powered state. In other words, in this example, when the memory is in the powered state, the second voltage is always applied to the dummy word line.

Figure 15:
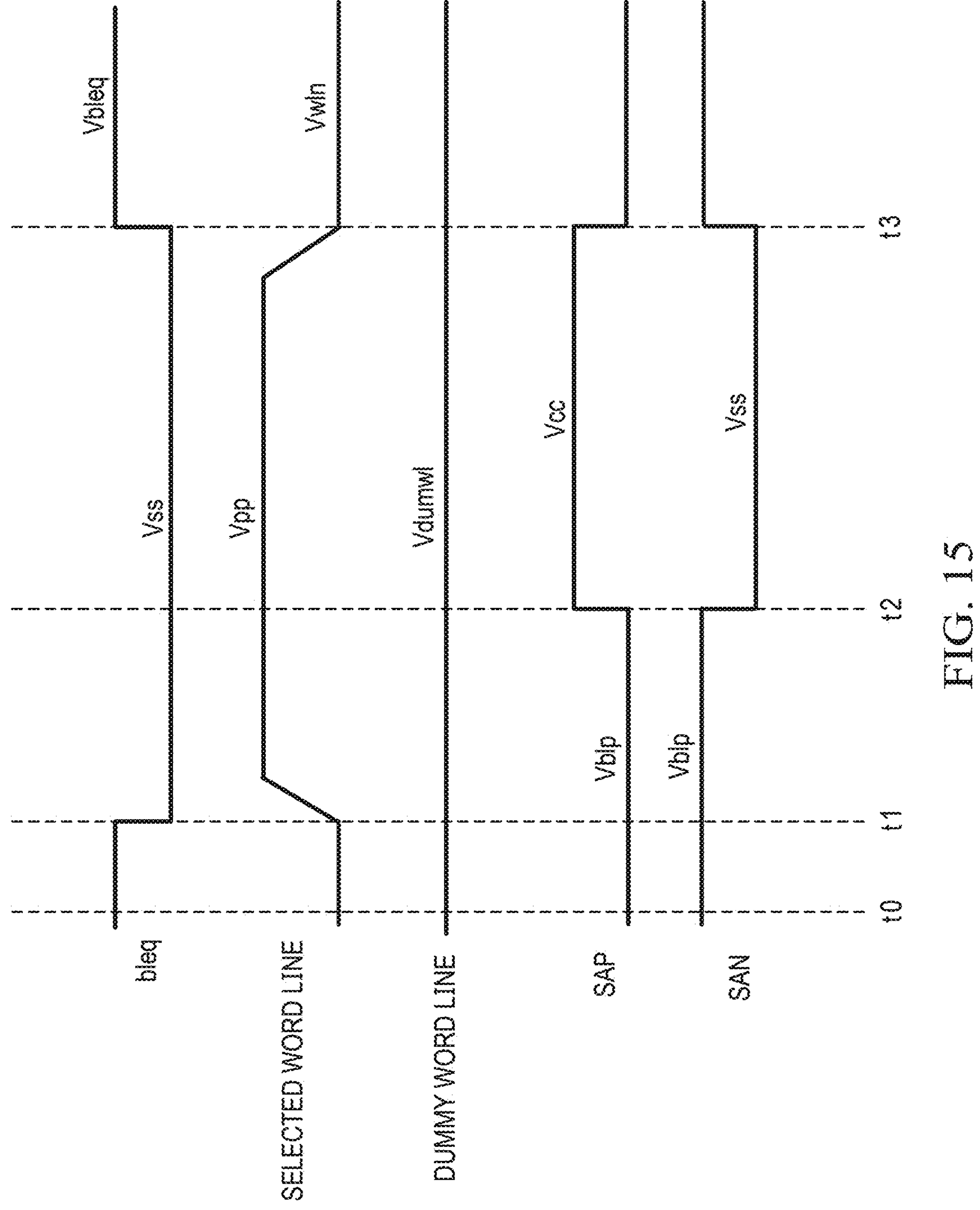
FIG. 15 is a signal timing diagram IV during a read operation executed by the sense amplifier shown in FIG. 11.

FIG. 15 is another signal timing diagram during a read operation executed by the sense amplifier shown in FIG. 11. A difference between this figure and FIG. 14 is the application timing of the voltage of the dummy word line. In this example, as shown in FIG. 15, when the memory is in the powered state, the second voltage Vdumwl is always applied to the dummy word line to make the dummy word line kept in an on state, and the cell capacitor of the dummy memory cell is always connected to the bit line to provide fixed capacitance, such that the sense margin of the bit line can be increased at the charge sharing phase. In addition, such setting can maintain the original read operation, and the adjustment of the read operation is avoided, such that product cycles are shortened.

In some examples, the second voltage Vdumwl applied to the dummy word line is less than the first voltage Vpp applied to the selected word line. As described above, if a storage voltage of the memory cell is larger, the gate voltage turning on the cell transistor needs to be larger. A storage voltage of the dummy memory cell is the pre-charging voltage Veq, and a maximum storage voltage of the selected memory cell is VDD, generally Veq=VDD/2, such that the second voltage Vdumwl applied to the dummy word line may be less than the first voltage Vpp applied to the selected word line.

Figure 16:
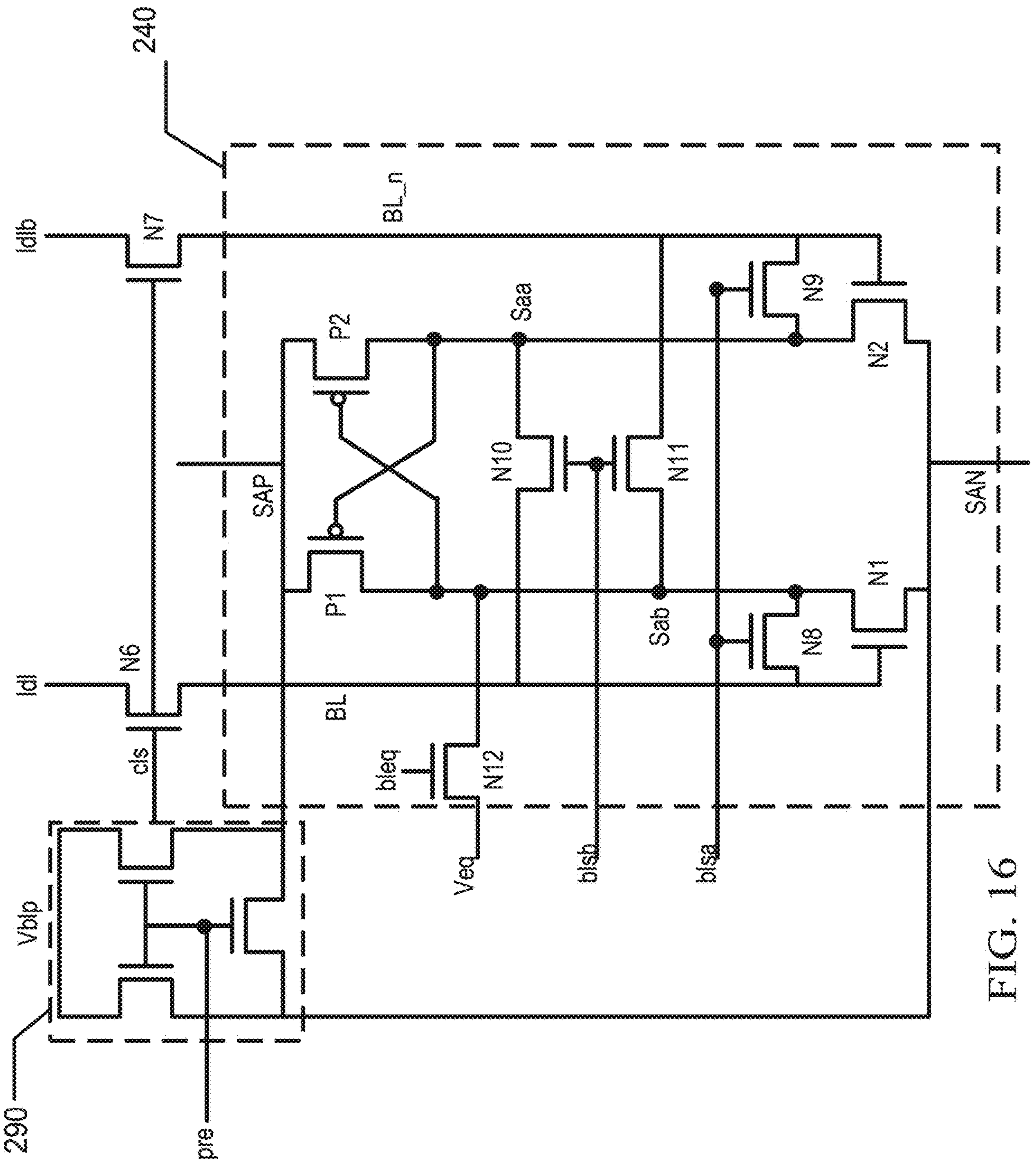
FIG. 16 is a schematic diagram of another circuit comprising a memory of a sense amplifier provided by examples of the present disclosure.

FIG. 16 is a schematic diagram of another circuit comprising a memory of a sense amplifier provided by examples of the present disclosure. As shown in FIG. 11, the sense amplifier 240 comprises transistors P1, P2, N1, and N2, wherein sources of the transistors P1 and P2 are connected to a power supply node SAP, and sources of the transistors N1 and N2 are connected to a power supply node SAN. A drain of the transistor N1, a drain of the transistor P1, and a gate of the transistor P2 are connected, and a junction is a sense node Sab. A drain of the transistor N2 is connected with a drain of the transistor P2 and a gate of the transistor P1, and a junction is a sense node Saa.

The sense amplifier 240 further comprises offset cancellation transistors N8 and N9, wherein a bit line BL is connected to the sense node Sab through the offset cancellation transistor N8, and a complementary bit line BL_n is connected to the sense node Saa through the offset cancellation transistor N9. Gates of the offset cancellation transistors N8 and N9 are controlled by an offset cancellation signal blsa, and when the blsa is activated (for example, in a high level), the offset cancellation transistors N8 and N9 are turned on.

The sense amplifier further comprises isolation transistors N10 and N11, wherein the bit line BL is further connected to the sense node Saa through the isolation transistor N10, and the complementary bit line BL_n is connected to the sense node Sab through the isolation transistor N11. Gates of the isolation transistors N10 and N11 are controlled by an isolation signal blsb, and when the blsb is activated (for example, in a high level), the isolation transistors N10 and N11 are turned on. Furthermore, the bit line BL is further connected with the gate of the transistor N1, and the complementary bit line BL_n is further connected with the gate of the transistor N2.

The sense amplifier 240 further comprises a pre-charging transistor N12, wherein a drain of the pre-charging transistor N12 is connected to the sense node Saa or Sab, a gate is controlled by a pre-charging signal bleq, and when the bleq is activated (for example, in a high level), the pre-charging transistor N12 is turned on to provide a pre-charging voltage Veq to the sense node Saa or Sab.

The memory further comprises a power supply module 290 connected to power supply nodes SAP and SAN and configured to provide different voltages to the power supply nodes SAP and SAN, for example, provide a balanced voltage Vblp, a high supply voltage Vcc, and a ground voltage Vss.

In addition, like the memory shown in FIG. 11, the memory further comprises column selection transistors N6 and N7, wherein the column selection transistor N6 is connected to the bit line Bl and a local data line ldl, the column selection transistor N7 is connected to the complementary bit line BL_n and a differential local data line Idlb, and gates of the column selection transistors are controlled by a column selection signal cls.

In an example, the pre-charging transistors N3, N4, and N12, the balanced transistor N5, the column selection transistors N6 and N7, the offset cancellation transistors N8 and N9, and the isolation transistors N10 and N11 may all be NMOS transistors.

Figure 17:
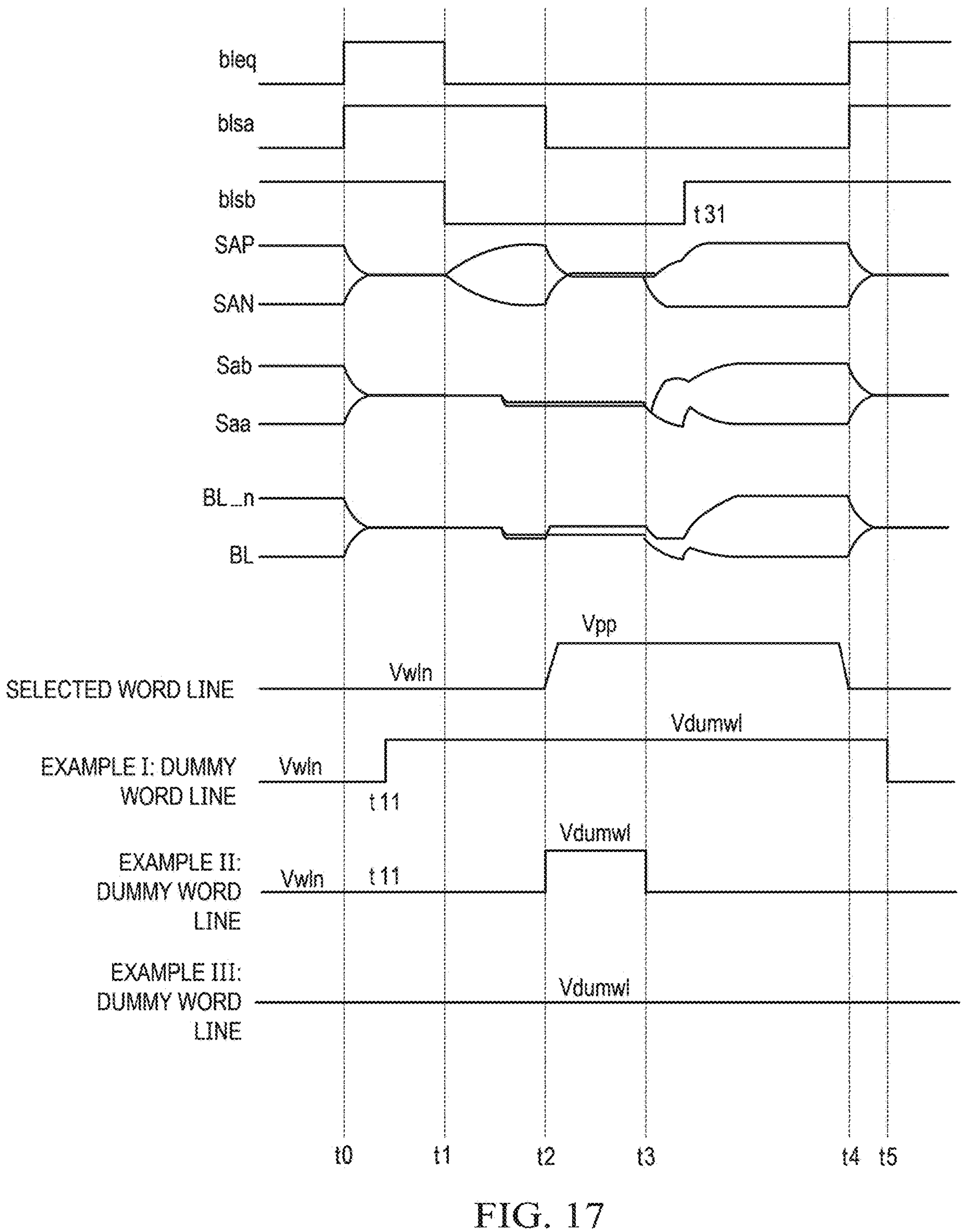
FIG. 17 is a signal timing diagram during a read operation executed by the sense amplifier shown in FIG. 16.

FIG. 17 is a signal timing diagram during a read operation executed by the sense amplifier shown in FIG. 16. As shown in FIG. 17, at a time period from t0 to t1, e.g., the pre-charging phase, the offset cancellation signal blsa, the isolation signal blsb, and the pre-charging signal bleq are at a high level, and the offset cancellation transistors N8 and N9, the isolation transistors N10 and N11, and the pre-charging transistor N12 are turned on to pre-charge the bit line BL, the complementary bit line BL_n, and the sense nodes Saa and Sab to the pre-charging voltage Veq. Voltages of the power supply nodes SAP and SAN both are balanced voltages Vblp.

At the pre-charging phase, a control turn-off voltage Vwln is applied to all normal word lines, and the normal word lines are in an off state. However, during at least part of the pre-charging phase, a second voltage Vdumwl is applied to at least one dummy word line, such that a cell capacitor of a dummy memory cell coupled to the dummy word line is charged to the pre-charging voltage Veq. In an example, as shown Example I in FIG. 17, at a first moment t11 after a period of time from the start of the pre-charging phase, the second voltage Vdumwl may be applied to the dummy word line, or the second voltage Vdumwl is applied to the dummy word line at a start moment t0 of the pre-charging phase.

At a time period from t1 to t2, the blsa is still at a high level to make the offset cancellation transistors N8 and N9 in an on state, the gate of the transistor N1 is connected with the drain thereof, and the gate of the transistor N2 is connected with the drain thereof. The bleq is switched to a low level to turn off the pre-charging transistor N12, so as to stop providing the pre-charging voltage Veq to the sense node Saa or Sab. The blsb is switched to a low level to turn off the isolation transistors N10 and N11, so as to prevent voltages of the sense nodes Saa and Sab from affecting each other. The power supply node SAP is switched to a high supply voltage Vcc, and the power supply node SAN is switched to a ground voltage Vss to provide a drive voltage to a sense amplifier. This time period is an offset calibration phase, and in this time period, a voltage difference of the sense nodes Saa and Sab (e.g., the bit line BL and the complementary bit line BL_n) is equal to a threshold voltage difference of two NMOS transistors N1 and N2. The voltage difference of the sense nodes Saa and Sab is used for compensating threshold voltage mismatch of the two NMOS transistors N1 and N2 at the subsequent sense amplification phase, such that the voltage difference of the sense nodes Saa and Sab at the phase is referred to as a compensation voltage.

At the offset calibration phase, the control turn-off voltage Vwln is applied to all normal word lines, and the normal word lines are in the off state. As shown in Example I in FIG. 17, the second voltage Vdumwl is applied to at least one dummy word line, such that the cell capacitor of the dummy memory cell maintains a voltage same as the bit line.

At a time period from t2 to t3, which is the first time period, e.g., the charge sharing phase, the blsa is switched to a low level, the offset cancellation transistors N8 and N9 are cut off, and the sense nodes Saa and Sab store the above compensation voltage. Voltages of the power supply nodes SAP and SAN are restored to the balanced voltage Vblp.

At the charge sharing phase, the first voltage Vpp is applied to a selected word line to turn on a cell transistor of a selected memory cell coupled to the selected word line, charge sharing is performed between the cell capacitor and the bit line, such that a small change is generated in the voltage of the bit line BL again, but the voltage of the complementary bit line BL_N is unchanged.

At the charge sharing phase, the second voltage Vdumwl is maintained to apply to at least one dummy word line, such that the cell capacitor of the dummy memory cell is connected to the bit line to adjust bit line capacitance $C_{BL}$ of the bit line BL, so as to increase voltage variations of the bit line, e.g., increase a sense margin.

At a time period from t3 to t4, which is a third time period, e.g., the sense amplification and write back phase, the power supply node SAP is gradually pulled up to the high supply voltage Vcc, the power supply node SAN is gradually pulled down to the ground voltage Vss, and the sense amplifier performs pre-sensing. With a moment t31, the blsb is switched to a high level, such that the isolation transistors N10 and N11 are turned on, the voltages of the bit line BL and the complementary bit line BL_n are transmitted to the sense nodes Saa and Sab, and the sense amplifier starts amplifying the voltages of the bit line BL and the complementary bit line BL_n, so as to read data. At this time period, the first voltage Vpp is still applied to the selected word line, such that the bit line BL may write the data back to the cell capacitor of the selected memory cell.

At the sense amplification and write back phase, since the sense nodes Saa and Sab (as well as the bit line BL and the complementary bit line BL_n) store the compensation voltage, a mismatched voltage brought by the threshold voltage mismatch between the two NMOS transistors N1 and N2 at the sense amplifier may be compensated, such that a voltage difference between the bit line BL and the complementary bit line BL_n may truly reflect data in the memory cell, thereby improving the accuracy of data read from the sense amplifier.

After a moment t4, the bleq and the blsa are re-switched to a high level, and the bit line BL and the complementary bit line BL_n are pre-charged to the pre-charging voltage Veq again. The power supply nodes SAP and SAN are re-switched to the balanced voltage Vblp.

At the sense amplification and write back phase (e.g., at a time period from t4 to t5), the second voltage Vdumwl is maintained to be applied to the dummy word line until a moment t6 after the moment t5.

In this example, when the read operation comprises an offset cancellation phase, the storage voltage of the cell capacitor of the dummy memory cell may be made to be same as the voltage of the bit line before the offset cancellation phase, so as to reduce the impact on the offset cancellation phase. In this example, the second voltage is applied to the dummy word line from the first moment t11 of the pre-charging phase until the moment t6 after the sense amplification and write back phase ends. Through such setting, the second voltage may be a small voltage, thereby saving power consumption.

In some other examples, as shown in Example II of FIG. 17, the second voltage Vdumwl may also be applied to the dummy word line only at the charge sharing phase (e.g., the first time period). In yet some further examples, the second voltage may be applied to the dummy word line at the offset cancellation phase and the charge sharing phase, or the second voltage is applied to the dummy word line at part of the offset cancellation phase close to the pre-charging phase, at the offset cancellation phase, and at the charge sharing phase. In still some further examples, as shown in Example III of FIG. 17, when the memory is in the powered state, the second voltage Vdumwl may always be applied to the dummy word line.

In some examples, as shown in FIG. 10, the memory cell array comprises a plurality of blocks, each sense amplifier is connected to bit lines each for the two blocks, wherein the block where the selected word line is a first block, and the other block connected to the same sense amplifier as a bit line of the first block is a second block. In other words, the a bit line for the first block and a bit line for the second block are connected to the sense amplifier, and the selected word line is one of the plurality of word lines of the first block.

The peripheral circuit is configured to: while applying the second voltage to a first dummy word line in the first block, apply the second voltage to a second dummy word line in the second block.

The sense amplifier uses two bit lines to sense data of the memory cell, and in order to accurately read the data, it needs to be ensured that voltages and capacitance values of the two bit lines used match each other. Therefore, in this example, the second voltage is applied to the first dummy word line of the first block and the second dummy word line of the second block simultaneously, such that bit line capacitances $C_{BL}$ of the bit line BL and the complementary bit line BL_n participating the read operation are the same, and the accuracy of the read operation can be improved.

Herein, the second voltage being applied to the first dummy word line in the first block and the second dummy word line of the second block simultaneously comprises: when the timing for applying the first voltage to the first dummy word line in the first block is any one of the above, such as the timing shown in FIG. 12, FIG. 13, FIG. 14, FIG. 15, and FIG. 17, synchronously applying the same second voltage to the first dummy word line in the first block and the second dummy word line in the second block.

In some examples, the number of the first dummy word lines in the first block that are applied with the second voltage is equal to the number of the second dummy word lines in the second block that are applied with the second voltage. That is, if several dummy word lines are turned on in the first block, the same number of the dummy word lines are also turned on in the second block.

In some examples, the peripheral circuit is configured to:

acquire an activated row address;

determine, according to the activated row address, a first dummy row address in the first block and a second dummy row address in the second block; determine the first dummy word line and the second dummy word line based on the first dummy row address and the second dummy row address; and determine the selected word line based on the activated row address.

In an example, the activated row address is sent to the memory with an activation command ACT. When a command decoder of the memory receives the activation command ACT, an address buffer receives and buffers the activated row address. The activated row address may comprise a bank group address to be activated, a bank address, and a row address. The bank group address and the bank address may be transmitted to a bank group/bank controller to determine a selected bank, and the row address is transmitted to a row decoder to determine a selected word line from the selected bank.

In some examples, one or more dummy word lines in all blocks in the bank may be controlled to turn on or off at the same time. Then based on the bank address, all dummy row addresses to be activated in the bank may be determined, and all the dummy row addresses comprise the first dummy row addresses and the second dummy row addresses. In an example implementation, during the read operation, the second voltage is applied or stopped from applying to at least one dummy word line of each of all blocks in the selected bank at the same time, and the number of the dummy word lines in different blocks that are applied with the second voltage is the same, such that the dummy word lines of the first block and the second block can be turned on or off at the same time.

In some examples, one or more dummy word lines in all the blocks in a bank group may also be controlled to turn on or off at the same time. Then based on the bank group address, all dummy row addresses to be activated in the bank group may be determined, and all the dummy row addresses comprise the first dummy row addresses and the second dummy row addresses. In other words, one or more dummy word lines in each block in the bank group executing the read operation are activated (herein, the numbers of the dummy word lines activated in different blocks are the same), so as to make the first dummy word line and the second dummy word line activated.

In some examples, the first dummy row addresses and the second dummy row addresses may also be determined based on the row address. The row address corresponding to any one of normal word lines in the block can turn on at least one dummy word line in the block, and can turn on at least one dummy word line of a block coupled to the same group of sense amplifiers as the block. In the present disclosure, a circuit implementing the function is not limited.

Figure 18:
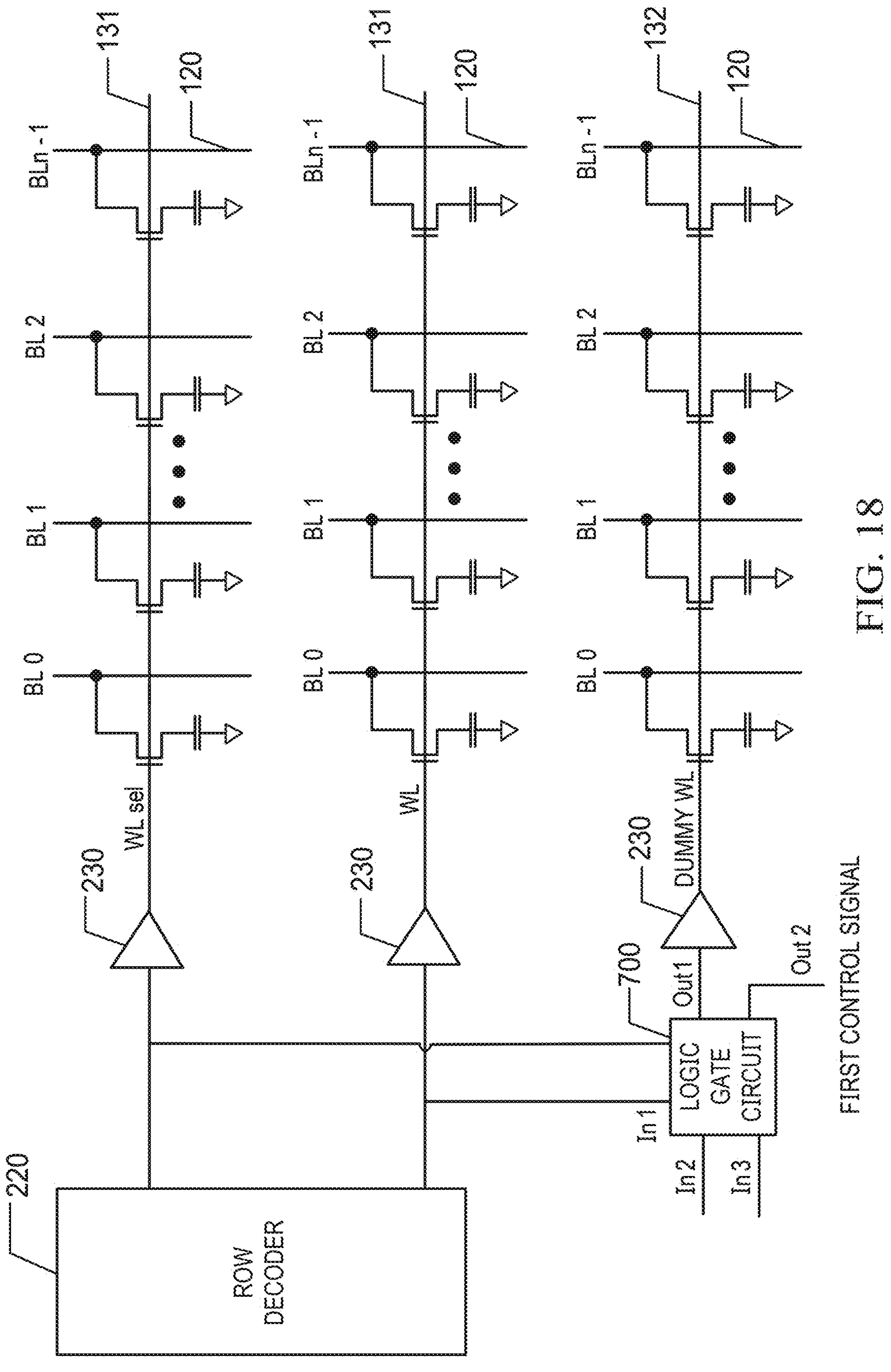
FIG. 18 is a schematic circuit diagram of a memory comprising a row decoder and a word line driver provided by examples of the present disclosure.

In some examples, as shown in FIG. 18, the row decoder 220 outputs a row selection signal after receiving the row address, and the row selection signal is sent to a word line driver 230 corresponding to a selected word line WL sel, and controls the word line driver 230 corresponding to a selected word line WL sel to output a first voltage. In some examples, an input end of the word line driver 230 corresponding to the dummy word line 132 may be connected to an input end of the word line driver 230 corresponding to each normal word line 131 in the block, so as to synchronously send the row selection signal to the word line driver 230 corresponding to the dummy word line 132 when the row decoder 220 sends the row selection signal to the word line driver 230 corresponding to any one of the normal word lines 131, such that the dummy word line 132 can synchronously be turned on when any one of the normal word lines 131 in the block becomes the selected word line and is turned on.

In some examples, the input end of the word line driver 230 corresponding to the dummy word line 132 is provided with a logic gate circuit 700, a plurality of first input ends In1 of the logic gate circuit 700 are respectively connected to the input end of the word line driver 230 corresponding to each normal word line 131 in the block, and a first output end Out1 of the logic gate circuit 700 is connected to the word line driver 230 corresponding to the dummy word line 132. The logic gate circuit 700 is configured to control the word line driver 230 corresponding to the dummy word line 132 to generate a second voltage when any one of the first input ends In1 receives the row selection signal.

The logic gate circuit 700 further comprises a second output end Out2 configured to connect to a second input end In2 of a logic gate circuit corresponding to the dummy word line in the block coupled to the same group of sense amplifiers as the block. The second output end Out2 of the logic gate circuit 700 is configured to output a first control signal to the block coupled to the same group of sense amplifiers as the block when any one of the first input ends In1 receives the row selection signal. When receiving any one of the first control signal and the column selection signal, the logic gate circuit 700 controls the word line driver 230 to generate the second voltage.

In some examples, the logic gate circuit 700 further comprises a third input end In3 configured to receive a second control signal, and the second control signal is configured to determine whether the dummy word line is enabled. Based on the second control signal corresponding to each dummy word line, it may be determined whether one dummy word line or a plurality of dummy word lines in the block are turned on at a first time period.

In some other examples, it is also possible that one or more dummy word lines in all the blocks in the memory cell array are controlled to turn on or off at the same time. Then when the memory executes the read operation each time, one or more dummy word lines in each block are activated (herein, the number of the dummy word lines activated in different blocks is the same), so as to make the first dummy word line and the second dummy word line activated.

It is to be understood that, in some examples, it is also possible that when the memory in a powered state, the second voltage may also be always applied to at least one dummy word line of each of all blocks in the memory cell array. The number of the dummy word lines in different blocks that are applied with the second voltage is the same. Through such setting, circuits related to voltage control of the dummy word lines may be saved, such that a chip area is saved, and the read operation can be simplified.

The examples provided by the present disclosure are suitable for, and are not limited to, a dynamic random-access memory (DRAM) and a static random-access memory (SRAM). The DRAM includes, but is not limited to, a Double Data Rate (DDR) SDRAM, and a Low Power DDR (LPDDR). The double rate synchronous dynamic random-access memory further comprises a DDR4, a DDR5, a DDR6, and the like. The low power double rate synchronous dynamic random-access memory further comprises an LPDDR4, an LPDDR5, an LPDDR6, and the like.

Examples of the present disclosure further provide a memory system, comprising: a memory controller and the memory described in any one of the above examples; and the memory controller is configured to control the memory.

The memory and the memory system are further described below with reference to FIGS. 19 and 21.

Figure 19:
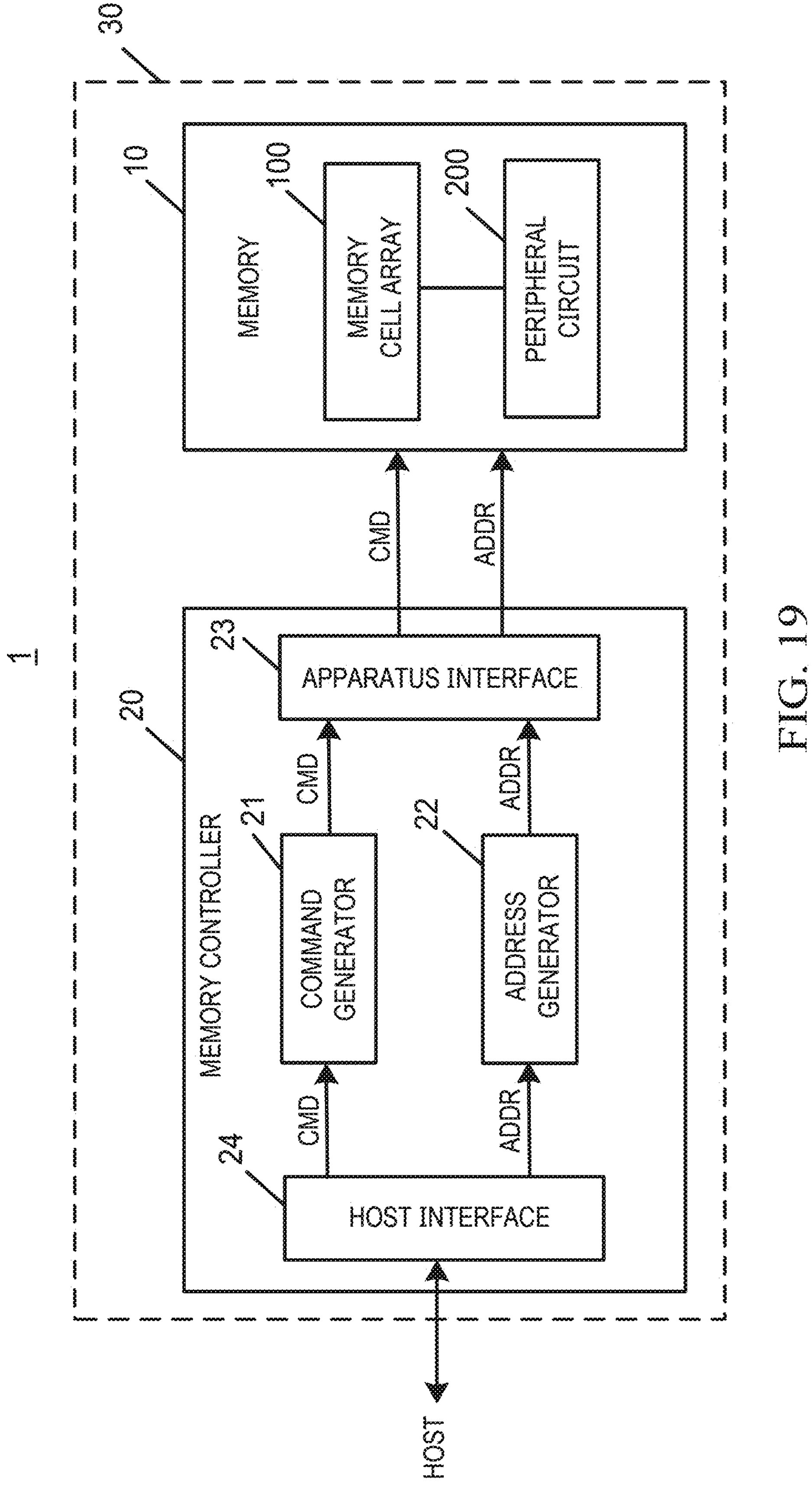
FIG. 19 is a schematic diagram of a block diagram of compositions of an example electronic apparatus according to an example of the present disclosure.
Figure 20:
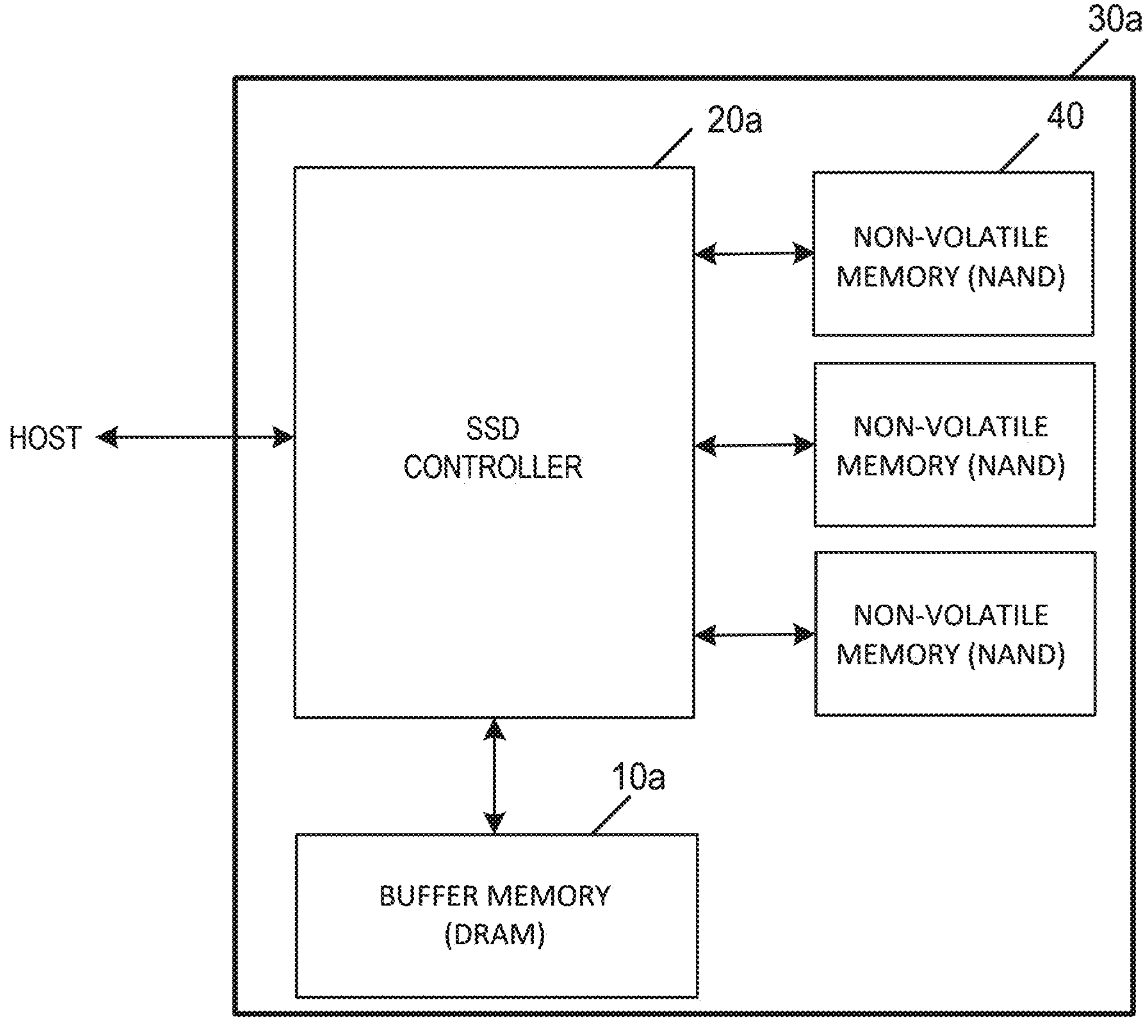
FIG. 20 is a schematic diagram of a block diagram of compositions of an example solid state drive (SSD) of an example of the present disclosure.

FIG. 19 is a schematic diagram of a block diagram of compositions of an example electronic apparatus according to an example of the present disclosure. The electronic apparatus 1 may comprise a mobile phone, a desktop computer, a laptop computer, a tablet computer, a vehicle computer, a gaming console, a printer, a positioning apparatus, a wearable electronic apparatus, a smart sensor, a virtual reality (VR) apparatus, an augmented reality (AR) apparatus, or any other suitable electronic apparatus having a memory. As shown in FIG. 20, the electronic apparatus 1 may comprise a host and a memory system 30, wherein the memory system 30 comprises a memory controller 20 and one or more memories 10. The host may be a processor of the electronic apparatus (such as a central processing unit (CPU), or a graphic processing unit (GPU)). The host may be configured to send or receive data to or from the memory 10. The memory controller 20 is coupled to the memory 10 and the host, and is configured to control the memory 10. The memory controller 20 may manage data stored in the memory 10, and communicate with the host.

The memory controller 20 may further be configured to control operations of the memory controller 20, such as read, erase, write, and refresh operations. In some implementations, the memory controller 20 is further configured to process error correction codes (ECC) with respect to the data read from or written to the memory 10. The memory controller 20 may further execute any other suitable functions, for example, format the memory 10.

In some particular examples, the memory controller 20 and one or more memories 10 may all be integrated into various types of electronic apparatuses. For example, the memory controller 20 may be integrated into a north bridge of a computer mainboard or directly integrated in a CPU of a computer, and the plurality of memories 10 may be integrated into an internal memory module. That is to say, the memory system 30 may be implemented and packaged into different types of end electronic products.

The memory controller 20 may send/receive data to/from the host, and may send a command CMD and an address ADDR to the memory 10. The memory controller 20 may comprise a command generator 21, an address generator 22, an apparatus interface 23 and a host interface 24. The host interface 24 may receive the command CMD and the address ADDR from the host; and the command generator 21 may generate an access command and the like by decoding the command CMD received from the host, and may provide the access command to the memory 10 through the apparatus interface 23. The access command may be a signal that instructs the memory 10 to write or read data by accessing rows of a memory cell array 100 corresponding to the address ADDR. The address generator 22 in the memory controller 20 may generate a row address and a column address to be accessed in the memory cell array 100 by decoding the address ADDR received from the host interface 24. Furthermore, the memory 10 may generate an address of a bank to be accessed when the memory cell array 100 comprises a plurality of banks.

Furthermore, the memory controller 20 may provide various signals to the memory 10 via the apparatus interface 23 to control memory operations such as write and read. For example, the memory controller 20 may provide a write command to the memory 10. The write command is used for instructing the memory 10 to execute a write operation to store data in the memory 10.

In some examples, the memory 10 may be a random access memory (RAM) such as a dynamic random access memory (DRAM), a synchronous DRAM (SDRAM), a static RAM (SRAM), a double data rate SDRAM (DDR SDRAM), a DDR2 SDRAM, a DDR3 SDRAM, a phase-change RAM (PRAM), a magnetic RAM (MRAM), a resistive RAM (RRAM), and the like. The following is described by using the DRAM as an example.

FIG. 20 is a schematic diagram of a block diagram of compositions of an example solid state drive (SSD) of an example of the present disclosure. Herein, the SSD may be understood as one of the aforementioned memory systems in FIG. 19. In this example, the DRAM may be used as a buffer memory.

As shown in FIG. 20, the SSD **30*a* may comprise an SSD controller 20*a*, a buffer memory 10*a*, and a non-volatile memory 40. The SSD controller 20*a* may provide a physical connection between a host and the SSD 30*a*. That is, the SSD controller 20*a* may provide an interface between the host and the SSD 30*a* according to a bus format of the host. The SSD controller 20*a* may decode an instruction provided from the host. The SSD controller 20*a* may access the non-volatile memory 40 based on a decoded result. The buffer memory 10*a* may temporarily store write data provided from the host, or data read from the non-volatile memory 40. When the host sends a read request, if data present in the non-volatile memory 40 is cached, the buffer memory 10*a* may support a cache function for directly providing the cached data to the host. A data transmission rate through the bus format (such as SATA or SAS) of the host is much higher than a data transmission rate of a memory channel of the SSD 30*a*. That is, when an interface speed of the host is significantly high, performance reduction caused by a speed difference may be minimized by providing the high-capacity buffer memory 10*a*. Furthermore, the buffer memory 10*a* may store an address mapping table of the non-volatile memory 40. The buffer memory 10*a*** may include, but is not limited to, the DRAM. The non-volatile memory 40 may be arranged as a storage medium of the SSD 30*a*. The non-volatile memory 40 may include, but is not limited to, an NAND memory.

Figure 21:
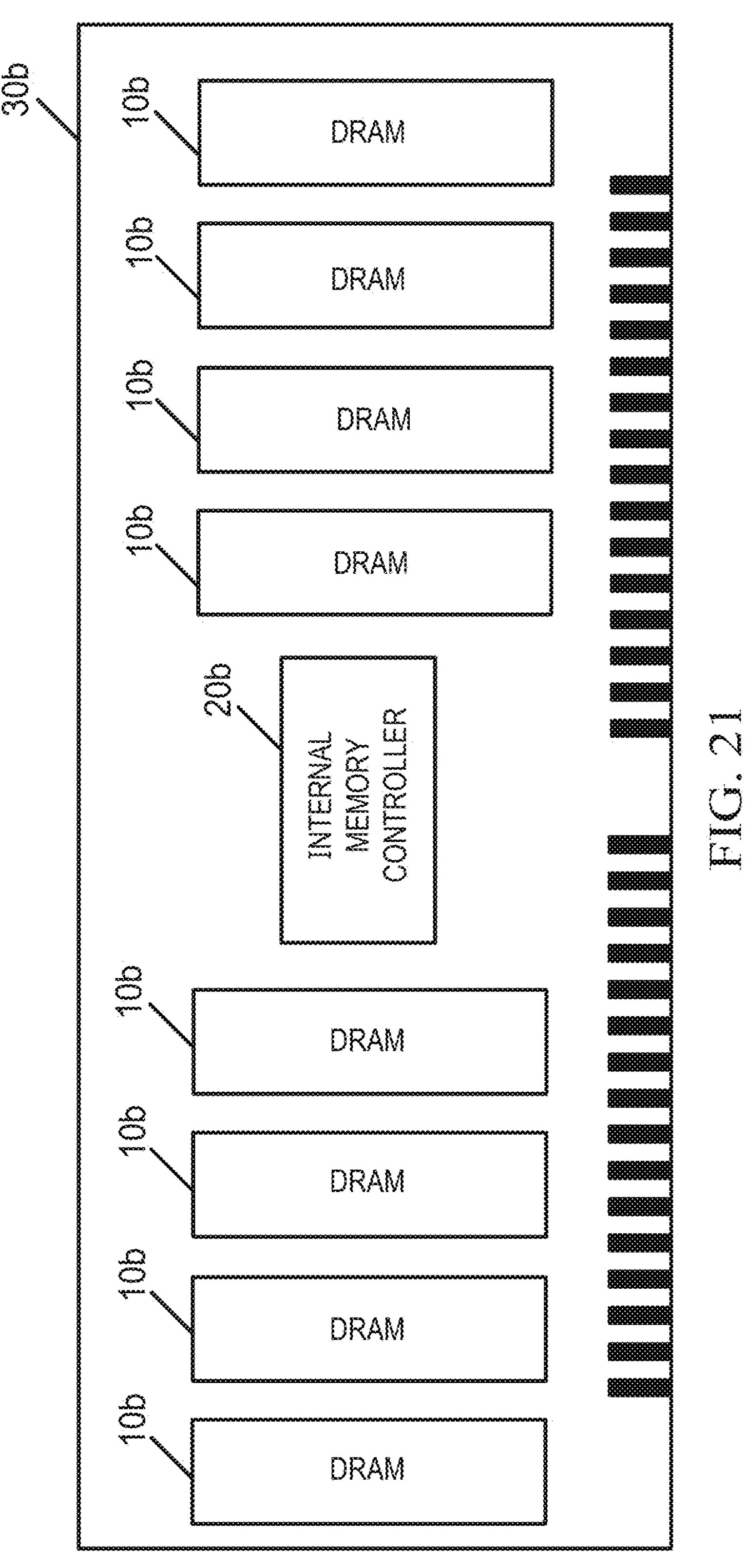
FIG. 21 is a schematic diagram of a block diagram of compositions of an internal memory of an example of the present disclosure.

FIG. 21 is a schematic diagram of a block diagram of compositions of an example internal memory of the present disclosure. Herein, the internal memory may be understood as one of the aforementioned memory systems in FIG. 19. In this example, a DRAM may be used as a storage medium.

As shown in FIG. 21, the internal memory 30*b* may be easily attached to or mounted to an electronic apparatus or dismounted from the electronic apparatus 1 through an interface shown in the figure. The internal memory 30*b* may comprise a plurality of volatile memories 10*b* (such as a DRAM) and an internal memory controller 20*b*. The internal memory 30*b* of a memory module may be configured to write, store, acquire (or read), and/or erase data under the control of a processor of a computer. In some examples, the internal memory controller 20*b* may communicate with the DRAM by using at least one communication protocol or technical standard generally associated with, for example, a dual inline memory module (DIMM), a DIMM with a register (RDIMM), a low-load DIMM (LRDIMM), a DIMM without a register (UDIMM), etc.

It is to be noted that, the buffer memory 10*a* in FIG. 20 and the volatile memory 10*b* in FIG. 21 both are an application scenario of the memory 10 in FIG. 19.

Figure 22:
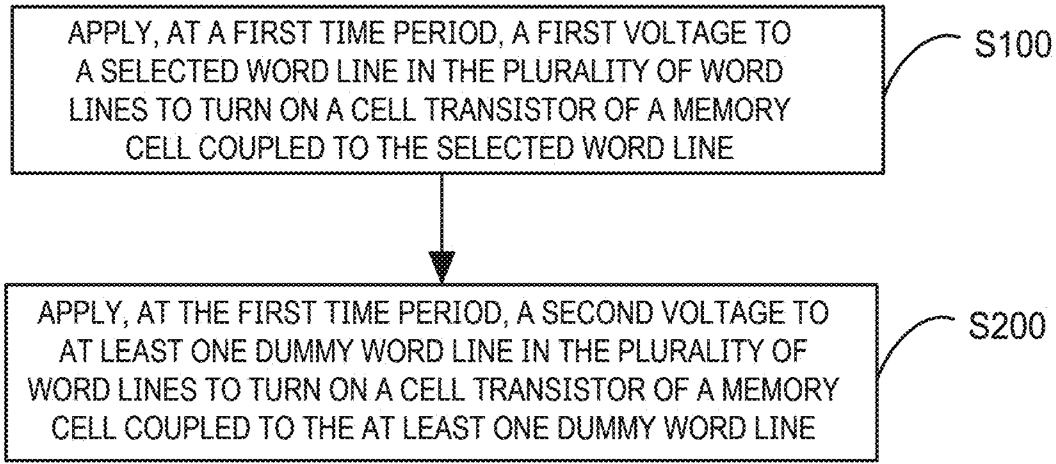
FIG. 22 is a flow diagram of an operation method of a memory provided by examples of the present disclosure.

Examples of the present disclosure further provide an operation method of a memory. The memory comprises a memory cell array, wherein the memory cell array comprises a plurality of memory cells, and bit lines and word lines are coupled to the plurality of memory cells. As shown in FIG. 22, the operation method of the memory comprises:

operation S100: applying, at a first time period, a first voltage to a selected word line in the plurality of word lines to turn on a cell transistor of a memory cell coupled to the selected word line; and operation S200: applying, at the first time period, a second voltage to at least one dummy word line in the plurality of word lines to turn on a cell transistor of a memory cell coupled to the at least one dummy word line.

In some examples, at the first time period, charge sharing is executed between a cell capacitor of the memory cell coupled to the selected word line and the bit line. A cell capacitor of a dummy memory cell coupled to the dummy word line is configured to adjust bit line capacitance to adjust a sense margin of the bit line.

In an example, the first time period may be a charge sharing phase of a read operation.

In some examples, the operation method further comprises: at a second time period before the first time period, applying the pre-charging voltage to the bit line, and applying the second voltage to the at least one dummy word line.

In an example, the second time period may be comprised in a pre-charging phase of the read operation, and the pre-charging phase is located before the charge sharing phase.

In some examples, the operation method further comprises: at a third time period after the second time period, amplifying the voltage of the bit line that has been subjected to charge sharing;

applying the pre-charging voltage to the bit line at a fourth time period after the third time period; and applying the second voltage to the at least one dummy word line at the third time period and the fourth time period.

In an example, the third time period may be a sense amplification and write back phase of the read operation.

In some examples, a phase for the read operation on the memory cell coupled to the selected word line comprises the second time period, the first time period, the third time period, and the fourth time period. The operation method further comprises:

applying the second voltage to the at least one dummy word line at another time period, wherein the other time period comprises a time period between an end moment of the fourth time period and a start moment of a second time period for a next read operation phase.

Herein, the second time period, the first time period, the third time period, and the fourth time period of each read operation, as well as other time period between the adjacent read operations, form all time periods when the memory is in a powered state. In other words, when the memory is in the powered state, the second voltage is always applied to at least one dummy word line.

In some examples, the second voltage is less than the first voltage.

In some examples, the memory cell array comprises a plurality of blocks, each of the blocks comprises the plurality of memory cells, the plurality of blocks comprise a first block and a second block, a bit line for the first block and a bit line for second block are connected to the same sense amplifier, and the selected word line is located in the first block.

The operation method further comprises: while applying the second voltage to a first dummy word line in the first block, applying the second voltage to a second dummy word line in the second block.

In some examples, the operation method further comprises:

acquiring an activated row address;

determining, according to the activated row address, a first dummy row address in the first block and a second dummy row address in the second block; determining the first dummy word line and the second dummy word line based on the first dummy row address and the second dummy row address; and determining the selected word line based on the activated row address.

In the operation method provided by the examples of the present disclosure, at the first time period of the read operation, after a first voltage is applied to the selected word line in the plurality of normal word lines to turn on the cell transistor of the memory cell coupled to the selected word line, charge sharing is executed between the cell capacitor of the memory cell and the bit line. Meanwhile, at the first time period, the second voltage is applied to the at least one dummy word line to turn on the cell transistor of the memory cell coupled to the dummy word line, such that the cell capacitor of the memory cell is connected to the bit line, and bit line capacitance $C_{BL}$ can be adjusted, for example, the proportion of fixed capacitance in the bit line capacitance $C_{BL}$ is adjusted to increase a sense margin without increasing an area of the peripheral circuit.

For the method in the above examples, the example execution method has been described in detail in the examples related to products corresponding to the method, and details are not described herein again.

The methods disclosed in several method examples provided by the present disclosure can be combined arbitrarily without conflict to obtain a new method example.

The characteristics disclosed in several device examples provided in the present disclosure may be combined arbitrarily without conflict to obtain a new device example.

The above is only the implementations of the present disclosure and not intended to limit the scope of protection of the present disclosure. Any variations or replacements apparent to those skilled in the art within the technical scope disclosed by the present disclosure shall fall within the scope of protection of the present disclosure. Therefore, the protection scope of the present disclosure shall be subject to the protection scope of the claims.

What is claimed is:

1. A memory, comprising:

a memory cell array comprising a plurality of blocks, each comprising a plurality of memory cells, wherein the plurality of blocks comprise a first block and a second block;

bit lines coupled to the plurality of memory cells, wherein a bit line for the first block and a bit line for the second block are connected to a same sense amplifier;

a plurality of word lines coupled to the plurality of memory cells; and a peripheral circuit coupled to the bit lines and the word lines, and configured to:

apply, at a first time period, a first voltage to a selected word line in the plurality of word lines to turn on a cell transistor of a memory cell coupled to the selected word line;

apply, at the first time period, a second voltage to at least one dummy word line in the plurality of word lines to turn on a cell transistor of a memory cell coupled to the at least one dummy word line; and while applying the second voltage to a first dummy word line in the first block apply the second voltage to a second dummy word line in the second block.

2. The memory of claim 1, wherein at the first time period, a cell capacitor of the memory cell coupled to the selected word line shares charges with the bit line.

3. The memory of claim 2, wherein the peripheral circuit is configured to:

at a second time period before the first time period, apply a pre-charging voltage to the bit line, and apply the second voltage to the at least one dummy word line.

4. The memory of claim 3, wherein the peripheral circuit is further configured to:

at a third time period after the second time period, amplify a voltage of the bit line that has been subjected to charge sharing;

apply the pre-charging voltage to the bit line at a fourth time period after the third time period; and apply the second voltage to the at least one dummy word line at the third time period and the fourth time period.

5. The memory of claim 4, wherein a phase for a read operation on the memory cell coupled to the selected word line comprises the second time period, the first time period, the third time period, and the fourth time period; and the peripheral circuit is further configured to:

apply the second voltage to the at least one dummy word line at another time period, wherein the other time period comprises a time period between an end moment of the fourth time period and a start moment of a second time period for a next read operation phase.

6. The memory of claim 1, wherein the peripheral circuit is configured to:

acquire an activated row address;

determine a first dummy row address in the first block and a second dummy row address in the second block according to the activated row address;

determine the first dummy word line and the second dummy word line based on the first dummy row address and the second dummy row address; and determine the selected word line based on the activated row address.

7. The memory of claim 1, wherein the second voltage is less than the first voltage.

8. The memory of claim 1, wherein the word lines comprise the dummy word lines and normal word lines, and the selected word line is any one of the normal word lines; and the dummy word lines are located on two sides of a plurality of the normal word lines; or the dummy word lines are located between any two adjacent normal word lines.

9. A memory system, comprising:

one or more memories, comprising:

a memory cell array comprising a plurality of blocks, each comprising a plurality of memory cells, wherein the plurality of blocks comprise a first block and a second block;

bit lines coupled to the plurality of memory cells, wherein a bit line for the first block and a bit line for the second block are connected to a same sense amplifier;

a plurality of word lines coupled to the plurality of memory cells; and a peripheral circuit coupled to the bit lines and the word lines, and configured to:

apply, at a first time period, a first voltage to a selected word line in the plurality of word lines to turn on a cell transistor of a memory cell coupled to the selected word line;

apply, at the first time period, a second voltage to at least one dummy word line in the plurality of word lines to turn on a cell transistor of a memory cell coupled to the at least one dummy word line; and while applying the second voltage to a first dummy word line in the first block apply the second voltage to a second dummy word line in the second block; and a memory controller coupled to the memories and configured to control the memories.

10. The memory of claim 9, wherein at the first time period, a cell capacitor of the memory cell coupled to the selected word line shares charges with the bit line.

11. The memory of claim 10, wherein the peripheral circuit is configured to:

at a second time period before the first time period, apply a pre-charging voltage to the bit line, and apply the second voltage to the at least one dummy word line.

12. The memory of claim 11, wherein the peripheral circuit is further configured to:

at a third time period after the second time period, amplify a voltage of the bit line that has been subjected to charge sharing;

apply the pre-charging voltage to the bit line at a fourth time period after the third time period; and apply the second voltage to the at least one dummy word line at the third time period and the fourth time period.

13. The memory of claim 12, wherein a phase for a read operation on the memory cell coupled to the selected word line comprises the second time period, the first time period, the third time period, and the fourth time period; and the peripheral circuit is further configured to:

apply the second voltage to the at least one dummy word line at another time period, wherein the other time period comprises a time period between an end moment of the fourth time period and a start moment of a second time period for a next read operation phase.

14. An operation method of a memory, wherein the memory comprises a memory cell array, the memory cell array comprises a plurality of memory cells, and bit lines and a plurality of word lines are coupled to the plurality of memory cells, the memory cell array comprises a plurality of blocks each comprising the plurality of memory cells, the plurality of blocks comprise a first block and a second block, and a bit line for the first block and a bit line for the second block are connected to a same sense amplifier;

wherein the operation method comprises:

applying, at a first time period, a first voltage to a selected word line in the plurality of word lines to turn on a cell transistor of a memory cell coupled to the selected word line;

applying, at the first time period, a second voltage to at least one dummy word line in the plurality of word lines to turn on a cell transistor of a memory cell coupled to the at least one dummy word line; and while applying the second voltage to a first dummy word line in the first block, apply the second voltage to a second dummy word line in the second block.

15. The operation method of a memory of claim 14, wherein at the first time period, charge sharing is performed between a cell capacitor of the memory cell coupled to the selected word line and the bit line.

16. The operation method of a memory of claim 15, further comprising:

at a second time period before the first time period, applying a pre-charging voltage to the bit line, and applying the second voltage to the at least one dummy word line.

17. The operation method of a memory of claim 16, further comprising:

at a third time period after the second time period, amplifying a voltage of the bit line that has been subjected to charge sharing;

applying the pre-charging voltage to the bit line at a fourth time period after the third time period; and applying the second voltage to the at least one dummy word line at the third time period and the fourth time period.

18. The operation method of a memory of claim 17, wherein a phase for a read operation on the memory cell coupled to the selected word line comprises the second time period, the first time period, the third time period, and the fourth time period; and the operation method further comprises:

applying the second voltage to the at least one dummy word line at another time period, wherein the other time period comprises a time period between an end moment of the fourth time period and a start moment of a second time period for a next read operation phase.

19. The operation method of a memory of claim 18, further comprising:

acquiring an activated row address;

determining, according to the activated row address, a first dummy row address in the first block and a second dummy row address in the second block;

determining the first dummy word line and the second dummy word line based on the first dummy row address and the second dummy row address; and determining the selected word line based on the activated row address.

20. The operation method of a memory of claim 14, wherein the second voltage is less than the first voltage.

* * * * *